US012754575B2

(12) United States Patent
Kim et al.

(10) Patent No.: US 12,754,575 B2
(45) Date of Patent: Oct. 6, 2026

(54) VOLTAGE CONTROL DEVICE AND METHOD CONSIDERING LINE POWER LOSS IN VOLTAGE DROP USING CVR FACTOR

(71) Applicant: CROCUS INC., Seoul (KR)

(72) Inventors: Bok Nyun Kim, Seoul (KR); Myeong Hoon Song, Seoul (KR); Daniel Jesuph Lim, Seoul (KR)

(73) Assignee: CROCUS INC., Seoul (KR)

( * ) Notice: Subject to any disclaimer, the term of this patent is extended or adjusted under 35 U.S.C. 154(b) by 465 days.

(21) Appl. No.: 18/237,987

(22) Filed: Aug. 25, 2023

(65) Prior Publication Data

US 2024/0393814 A1 Nov. 28, 2024

(30) Foreign Application Priority Data

May 26, 2023 (KR) ........................ 10-2023-0068012

(51) Int. Cl.

*G05F 1/10* (2006.01)
*G01R 19/25* (2006.01)
*G05F 1/66* (2006.01)

(52) U.S. Cl.

CPC ........... *G05F 1/10* (2013.01); *G01R 19/2513* (2013.01); *G05F 1/66* (2013.01)

(58) Field of Classification Search

CPC ..... G05F 1/10; G05F 1/12; G05F 1/20; G05F 1/24; G05F 1/40; G05F 1/44; G05F 1/625; G05F 1/66; G05F 1/67; G05F 1/70; G01R 19/25; G01R 19/2513; G01R 19/0084; G01R 19/0092

USPC ........ 323/222–226, 266, 271–276, 282–285, 323/304, 311–317, 351, 356

See application file for complete search history.

(56) References Cited

U.S. PATENT DOCUMENTS 10,666,048 B2 * 5/2020 Hall .................. H02J 13/00026

* cited by examiner

*Primary Examiner* — Thienvu V Tran
*Assistant Examiner* — Carlos O Rivera-Perez
(74) *Attorney, Agent, or Firm* — The PL Law Group, PLLC

(57) ABSTRACT

A voltage control device includes a voltage regulator module, a cooperative controller, and a conservation voltage reduction (CVR) factor calculator. The voltage regulator module regulates a voltage supplied to loads or reversely transmitted from the loads. The cooperative controller controls the voltage regulator module according to a target voltage or sending the target voltage to the voltage regulator module. The CVR factor calculator estimates a CVR factor. The target voltage is calculated by reflecting a voltage drop due to CVR using the CVR factor. The CVR factor is estimated in different methods according to at least one of a measurement time, a load state, and a representative value.

16 Claims, 13 Drawing Sheets

S264

VOLTAGE CONTROL DEVICE AND METHOD CONSIDERING LINE POWER LOSS IN VOLTAGE DROP USING CVR FACTOR

CROSS REFERENCE TO RELATED APPLICATIONS AND CLAIM OF PRIORITY

This application claims the benefit under 35 USC § 119 of Korean Patent Application No. 10-2023-0068012 filed on May 26, 2023, in the Korean Intellectual Property Office (KIPO), the entire disclosure of which is incorporated herein by reference for all purposes.

BACKGROUND

1. Field of the Invention

The present disclosure relates to a voltage control device and method that consider a power loss caused by lines in a process of controlling the voltage of a voltage regulator module that supplies power to loads using conservation voltage reduction (CVR).

2. Description of the Related Art

Conservation voltage reduction (CVR) may be used as one of energy reduction technologies involving energy consumption reduction and peak load reduction for efficiency and stable supply of power.

Conventionally, in most cases, a power exchange or a power plant supplying power to a power system or controlling the supply of power has performed CVR to power consumers in a unilateral manner because of, for example, the power peak. Recently, due to the emergence of new power sources, such as a photovoltaic power system or a vehicle-to-grid (V2G) system, supplying power to the power system, there is an increasing need to perform CVR in the vicinity of nodes of a power receiving system.

In addition, an electrical grid extending from the upstream of the power system to downstream loads is becoming more complicatedly branched, and the distance over which power is transmitted is increasing. Thus, for optimal load voltage control, it is necessary to consider not only a voltage drop due to CVR but also a power loss due to a line loss.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and the present disclosure is intended to propose a method of calculating a conservation voltage reduction (CVR) factor and using the CVR factor in a voltage drop operation for obtaining a CVR effect.

The present disclosure is intended to overcome the problem in that when a voltage drop due to CVR occurs, an excessive voltage drop increases a power loss due to the line resistance, thereby decreasing a power reduction effect. In this regard, the present disclosure may set a loss function and calculate a target voltage by minimizing the loss function.

In addition, the present disclosure is intended to control loads according to an optimal target voltage on the basis of a reduction in power caused by a voltage drop due to a CVR effect or a power loss due to a line loss when power is supplied to nodes (or the loads) within the allowable power range. Accordingly, an optimal electricity rate reduction or a resultant electricity rate reduction report may be provided.

In order to achieve the above at least one of the above objectives, according to one aspect of the present disclosure, there is provided a voltage control device including: a voltage regulator module regulating a voltage supplied to loads or reversely transmitted from the loads; a cooperative controller controlling the voltage regulator module according to a target voltage or sending the target voltage to the voltage regulator module; and a conservation voltage reduction (CVR) factor calculator estimating a CVR factor. The target voltage may be calculated by reflecting a voltage drop due to CVR using the CVR factor. The CVR factor may be estimated in different methods according to at least one of a measurement time, a load state, and a representative value.

A voltage control method according to the present disclosure may include: a data collection step of transmitting power data of a voltage regulator module to a data collector, wherein the voltage regulator module regulates a voltage supplied to loads or reversely transmitted from the loads; a target voltage calculation step of calculating, by the voltage regulator module, a target voltage to be regulated and collecting and storing a load-specific CVR factor; and step voltage control step of controlling, by a cooperative controller, the voltage regulator module according to the target voltage or sending the target voltage to the voltage regulator module. The target voltage may be calculated by reflecting a voltage drop due to CVR using the CVR factor. The CVR factor may be estimated in different methods according to at least one of a measurement time, a load state, and a representative value.

According to the present disclosure, the CVR factor may be calculated by at least one or a combination of measurement time-specific classification methods, load state-specific classification methods, and load-specific representative value selection methods.

The present disclosure may set a loss function including components by which a voltage drop effect due to CVR and a voltage increase effect caused by a power loss due to the line resistance are obtained. When the loss function is a function of a voltage or a voltage difference, the target voltage of the voltage regulator module subject to voltage regulation may be obtained by obtaining a solution by which the loss function is minimized or optimized.

According to the present disclosure, when power supplied to loads is controlled, power supplied to node equipment (i.e., load equipment) to use a CVR effect may be regulated by considering a line loss from a voltage control module to the loads while maintaining a lowest voltage within the allowable power range.

In addition, unlike conventional loads that only consume power at the downstream of a power system, loads of the recent power system may reversely transmit power to the upstream of the power system as distributed power sources, thereby causing the power system to be more complicated. Considering these features, the present disclosure may predict or control a voltage supplied to the loads. Accordingly, the present disclosure may provide an optimal electricity rate reduction effect to the owners or managers of the nodes (i.e., loads).

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

With reference to FIGS. 1 to 13, a voltage control device and method according to the present disclosure will be described.

Referring to FIGS. 6 and 9 to 13, a conservation voltage reduction (CVR) method using a CVR factor (or CVRf) and a CVR factor setting method according to the present disclosure will be described first.

The present disclosure may use a CVR factor in order to calculate a first voltage corresponding to a voltage drop due to CVR. The CVR factor may be a power fluctuation rate with respect to a voltage fluctuation rate. For example, when power is reduced by 2% in response to the reduction of a voltage by 1%, the CVR factor may be 2. The CVR factor may be used to estimate the amount of actually reduced power.

Since the load-specific CVR factor of each load connected to the downstream of a voltage regulator module 100 fluctuates (or changes) constantly, it is necessary to periodically scan or collect the load-specific CVR factor. Collection, transmission, learning, prediction, or the like of power data according to the present disclosure may be performed in the basic units of seconds or minutes. Thus, the unit of a period in which the load-specific CVR factor is scanned or collected by be set to second, minute, or hour.

Estimation or calculation of a reduction in power due to a voltage drop, a line power loss due to the line resistance, a predicted voltage, a target voltage, an electricity rate reduction, or a CVR factor may be performed in the scanning or collection unit in near real time.

For this reason, sufficient power data for calculation of the CVR factor may be collected according to the load. The CVR factor may be calculated as a specific constant value for each load by, for example, averaging. Thus, when a voltage drop determined by the calculation of a target voltage is calculated, the reduction in power due to a voltage drop subject to CVR may be calculated by multiplying the voltage drop (amount) with the CVR factor.

For example, when the current voltage is 225V, a future predicted voltage may be calculated by reflecting the tendency. Here, a first voltage corresponding to a voltage drop due to CVR is calculated on the basis of the predicted voltage, a line power loss is calculated, a target voltage (i.e., a modified second voltage) is calculated by reflecting the line power loss to the first voltage, and the target voltage is 220V. When the load-specific CVR factor for the voltage regulator module 100 subject to voltage regulation is 1.2 kW/V from past powder data, the reduction in power due to CVR may be calculated as being: Voltage drop (5V)×CVR factor (1.2).

Figure 6:
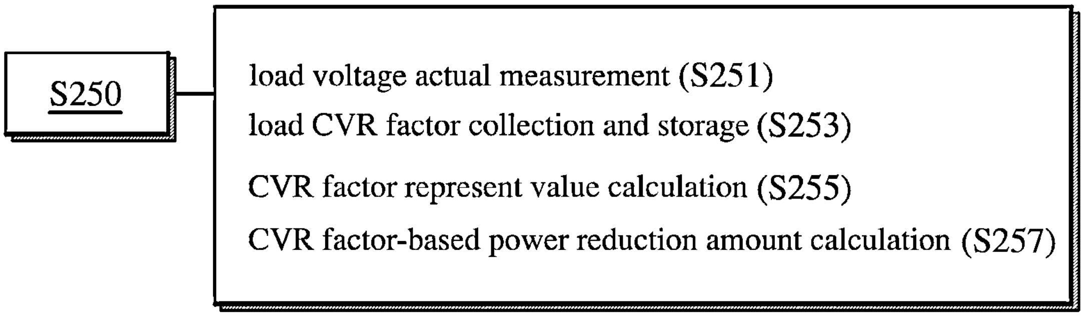
FIG. 6 is a diagram illustrating the first voltage calculation step according to the present disclosure.

Referring to FIG. 6, a first voltage calculation step S250 may include at least one of a load-specific voltage measuring step S251, a load-specific CVR factor collection and storage step S253, a CVR factor representative value calculation step S255, and a step S257 of calculating a reduction in power using a CVR factor. The voltage calculation step S250 may calculate a first voltage corresponding to the reduction in power due to the CVR. The first voltage calculation step S250 may be included in a target voltage calculation step S200 or a loss function step S240.

The load-specific voltage measuring step S251 may correspond to a data collection step S100, and may be continuously performed according to the set basic scanning or collection unit. The CVR factor is included in power data collected by the voltage regulator module 100. However, during a specific period, when maintained within a predetermined range like a unique characteristic of loads 50, the CVR factor may have a scanning or collection cycle separate from the power data collection of the data collection step S100.

The power data collected by the voltage regulator module 100 may include information necessary for the calculation of the CVR factor. The information necessary for the calculation of the CVR factor may include, for example, load-specific voltage data, load-specific power data, or a voltage adjustment time according to the voltage regulator module 100 or a voltage regulator 130.

Figure 9:
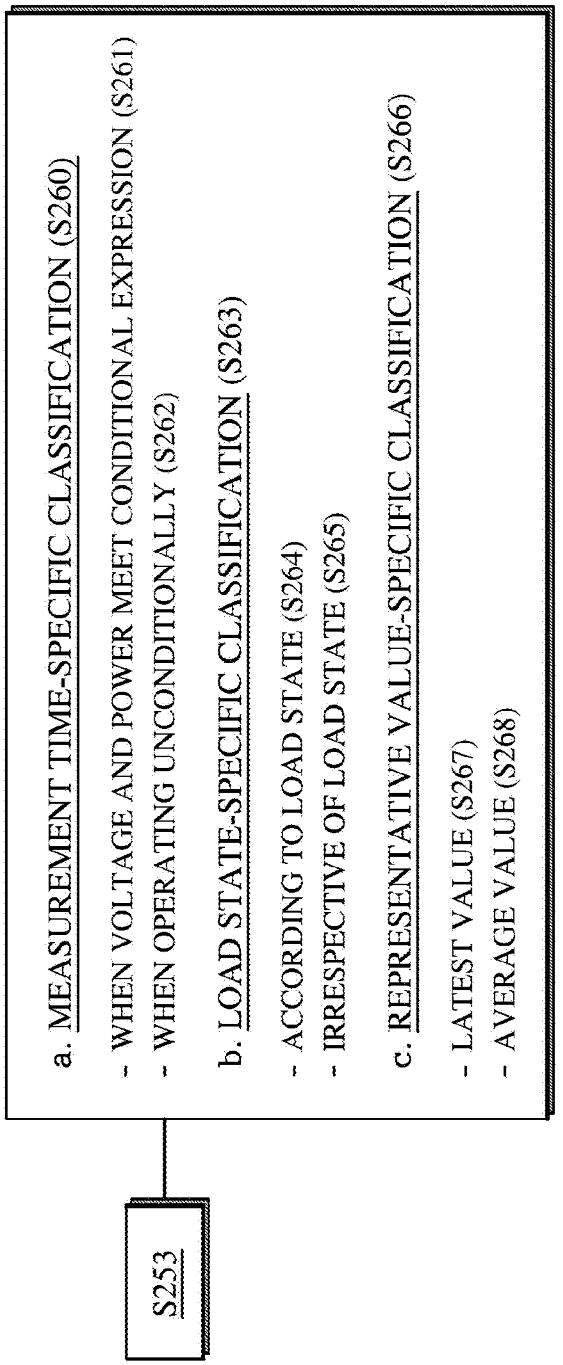
FIG. 9 is a diagram illustrating the load-specific CVR factor collection and storage step.

Referring to FIG. 9, the load-specific CVR factor collection and storage step S253 may include at least one of a measurement time-specific classification step S260, a load state-specific classification step S263, and a representative value-specific classification step S266.

The measurement time-specific classification step S260 may include a step S261 in which a predetermined condition for a voltage, power, or the like is met and a step S262 in which the load-specific CVR factor is calculated when the voltage regulator module 100 operates unconditionally or according to the operating time of the voltage regulator module 100.

Figure 10:
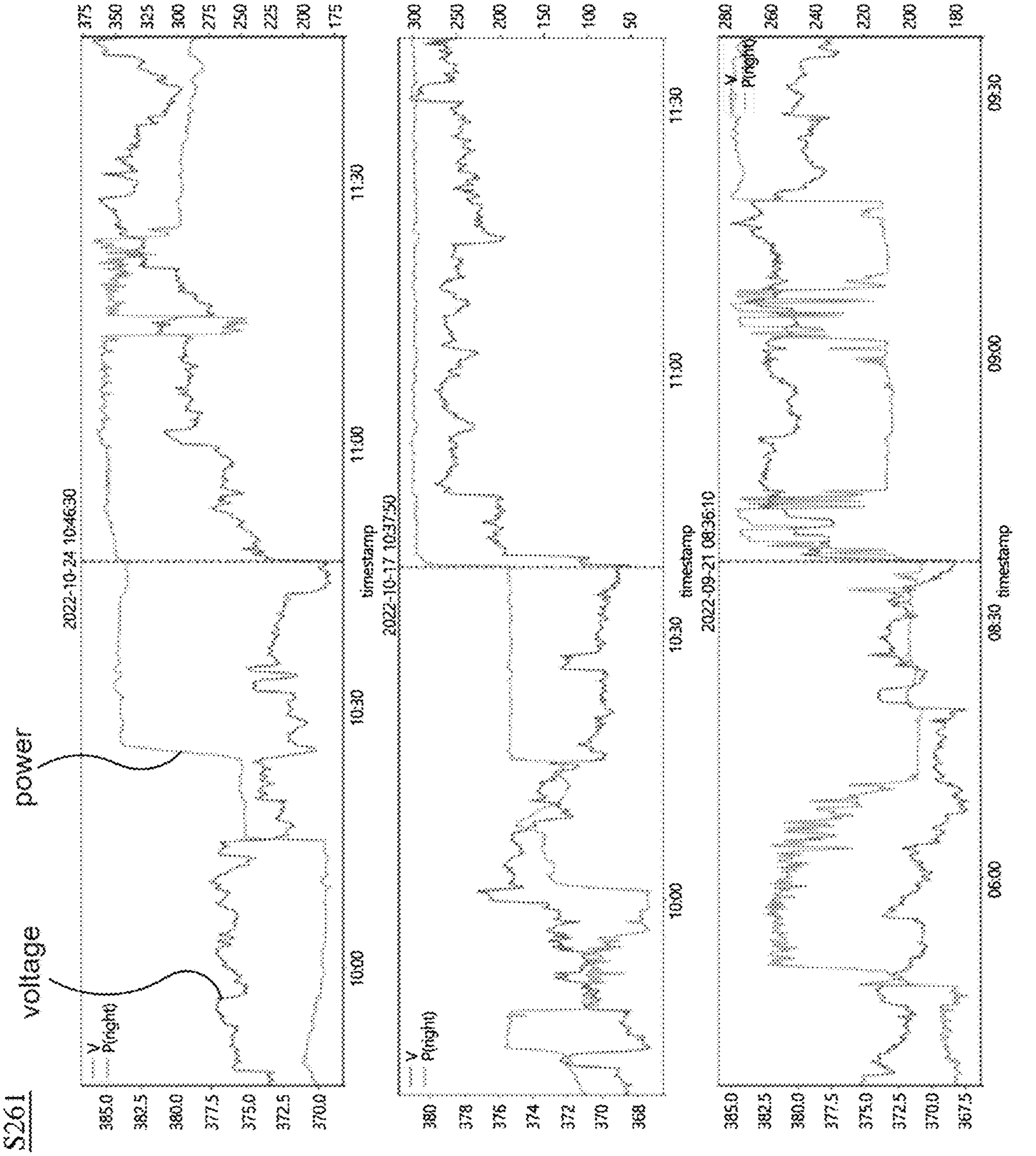
FIG. 10 illustrates a case in which a voltage and power meet a conditional expression in the measurement time-specific classification step according to the present disclosure.

Referring to FIG. 10, in the step S261, a CVR factor calculator may calculate the CVR factor from voltage and power fluctuations in second(s) or minute(s), such as one second or 10 seconds or one minute or 5 minutes, before and after a time meeting a predetermined condition from power data of the voltage regulator module 100 collected by a data collector 220.

The step S262 may also be used in a case in which only power data, voltage data, and the like are present and data in which the operating time of the voltage regulator module 100 or the voltage regulator 130 is recorded is absent.

Conditions of the step S261 may include whether a voltage difference ΔV or a power difference ΔP is a positive number or a negative number, whether or not the voltage difference ΔV or the power difference ΔP meets a predetermined range of a minimum value min_P or min_V, a maximum value max P, and the like, whether or not the load-specific CVR factor meets the range of an upper limit max_CVRf or a lower limit min_CVRf, and the like.

Estimation of the CVR factor in the step S261 may be available even in a situation in which it is difficult to control the voltage regulator module 100 or the voltage regulator 130. In this case, a voltage fluctuation may be caused by a load fluctuation (or a power fluctuation), and the causal relationship of the estimated CVR factor may be ambiguous. Thus, specific conditions such as "a voltage-power fluctuation rate is 1% or higher" or "the direction of fluctuation is the same" may be set for complementation.

Example conditions of the step S261 are as follows.

$$\Delta V > 0 \text{ and } \Delta P > 0 \text{ or } \Delta V < 0 \text{ and } \Delta P < 0 \quad \text{Condition 1}$$

$$\text{min\_P} < \%\Delta P < \text{max\_P} \quad \text{Condition 2}$$

$$\text{min\_V} < \%\Delta V \quad \text{Condition 3}$$

$$\text{min\_CVRf} < CVR \text{ factor} < \text{max\_CVRf} \quad \text{Condition 4}$$

Figure 11:
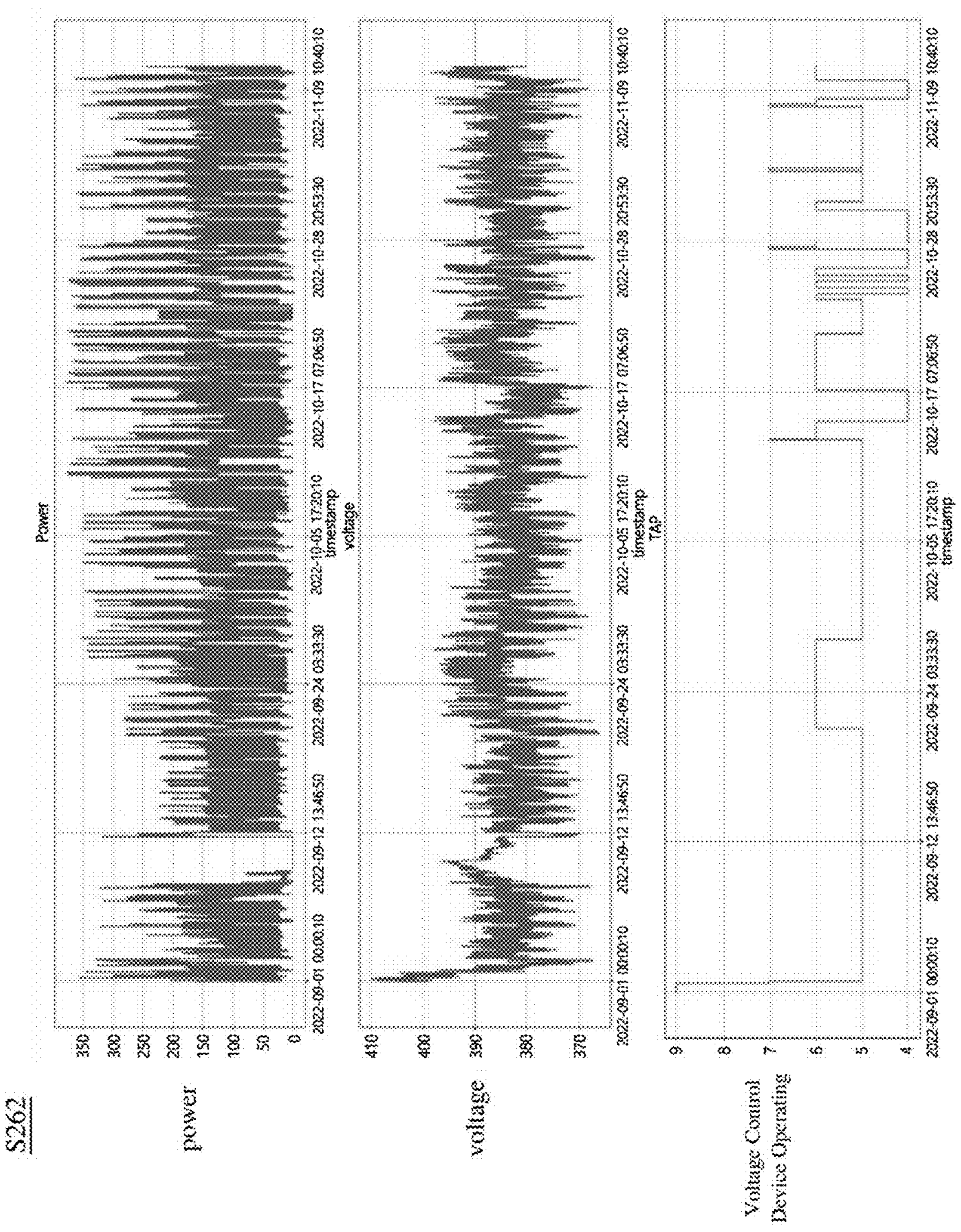
FIG. 11 illustrates a case in which the voltage regulator module operates unconditionally in the measurement time-specific classification step according to the present disclosure.

Referring to FIG. 11, data transmitted from the voltage regulator module 100 to the data collector 220 may include load-specific power data and data in which the operating time of the voltage regulator module 100 or the voltage regulator 130 is recorded.

In the step S262, a CVR factor calculator 255 may calculate the CVR factor from voltage or power fluctuations in second(s) or minute(s), such as 1 second or 10 seconds 1 minute or 5 minutes, before and after the operating time of the voltage regulator module 100 or the voltage regulator 130.

As the voltage changes at a power conversion operating time of the voltage regulator module 100 or the voltage regulator 130, power may also be significantly affected. Thus, the CVR factor may be estimated using the ratio of the power fluctuation rate with respect to the voltage fluctuation rate at the operating time.

The load state-specific classification step S263 may include a step S264 of calculating the CVR factor according to the load state including, for example, the operating state, the power output, and the amount of load (i.e., the amount of power consumption) or a step S265 of calculating the CVR factor irrespective of the load state.

Figure 12:
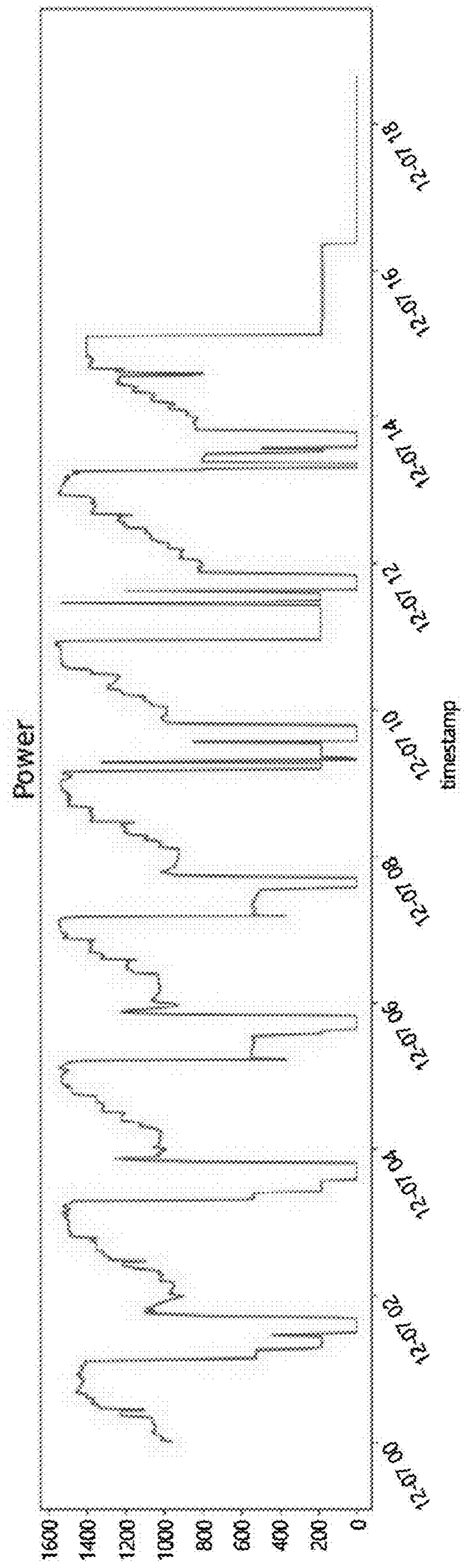
FIG. 12 illustrates the load state-specific classification step according to the present disclosure.

Referring to FIG. 12, in the step S264, the CVR factor calculator 255 may calculate the CVR factor according to the load state including the operating state and the amount of load-specific power consumption such as the power output of node equipment (or load equipment). The load state may be classified into maximum load, median load, light load, and the like according to the power consumption (or the amount of load). The step S265 may be configured to calculate the CVR factor irrespective of the load-specific load state unlike the step S264.

Figure 13:
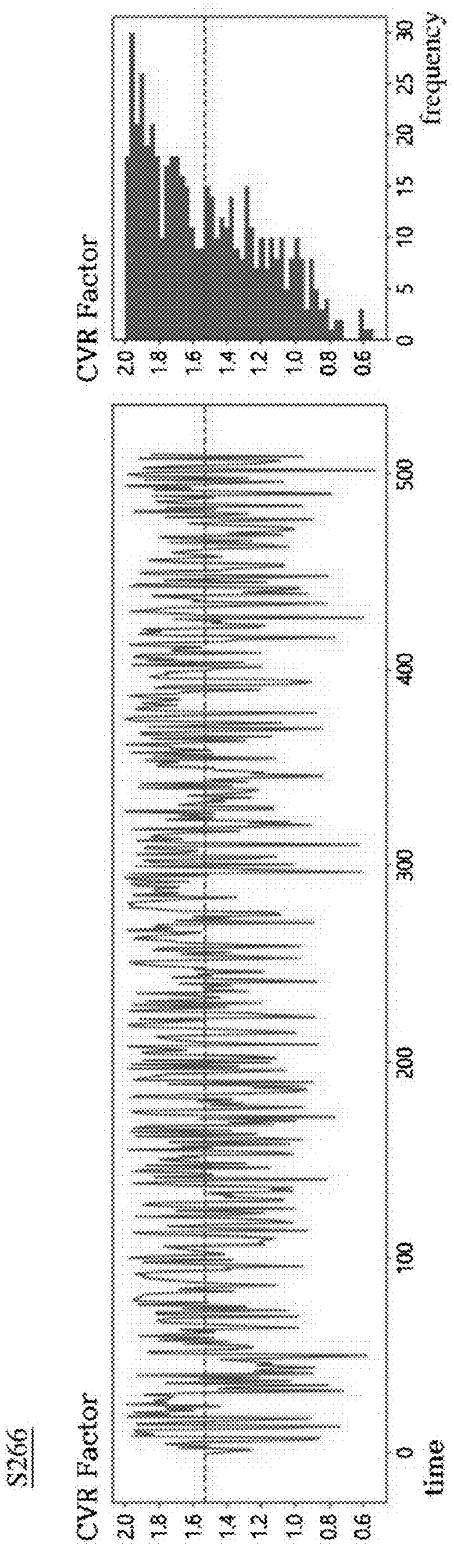
FIG. 13 illustrates the representative value-specific classification step S266.

Referring to FIG. 13, the representative value-specific classification step S266 may be configured to calculate the representative value of each of the load-specific CVR factors by, for example, a step S267 of adopting a latest value from the CVR factors calculated in the measurement time-specific classification step S260 or the load state-specific classification step S263 or a step S268 of averaging the CVR factors calculated in the measurement time-specific classification step S260 or the load state-specific classification step S263.

In the step S267 of adopting a latest value, the latest CVR-related characteristics of the corresponding load may be reflected. A power reduction ratio most suitable for the current situation may be reflected since the latest value is used. However, when a load situation changes suddenly, the volatility of the power reduction ratio may be significant.

In the step S268 of averaging the CVR factors, average CVR-related characteristics of a predetermined period such as one day, one week, one month, or one year, may be reflected. For example, the CVR factors may be affected by the season. Thus, when the averaging is based on classifying the periods according to the season, the average CVR-related characteristics of the load equipment may be reflected.

As a result, the load-specific CVR factor calculated in the load-specific CVR factor collection and storage step S253 may be calculated by at least one or a combination of the measurement time-specific classification step S260, the load state-specific classification step S263, and the representative value-specific classification step S266.

The CVR factor representative value calculation step S255 may calculate a CVR factor representative value used in calculating a target voltage of the voltage regulator module 100 subject to voltage regulation by using the load-specific CVR factor obtained in the load-specific CVR factor collection and storage step S253.

The CVR factor representative value may be obtained by, for example, averaging or weighted-averaging the load-specific CVR factors of the loads 50 located downstream of the corresponding voltage regulator module 100.

In this manner, even in the case that the branch structure of the loads is altered due to changes in or omission of the loads disposed downstream of the corresponding voltage regulator module 100, the CVR factor representative value of the corresponding voltage regulator module 100 may be calculated. In addition, even in the case that the voltage regulator module is complicatedly branched into multi-stage voltage regulation modules 110 and 120, the CVR factor representative value of the upstream voltage regulation module 110 may be calculated using the load-specific CVR factor obtained in the load-specific CVR factor collection and storage step S253. Thus, even in the case of an equipment change, for example, when the voltage regulator module 100 is installed or removed, a reduction in power may be continuously calculated or an electricity rate reduction may be provided.

When the power system has a simple branch structure, the load-specific CVR factor obtained in the load-specific CVR factor collection and storage step S253 may be directly used in the CVR factor representative value calculation step S255.

The step S257 of calculating the reduction in power using a CVR factor may be configured to calculate the reduction in power corresponding to a CVR factor-based voltage drop using the CVR factor representative value obtained in the CVR factor representative value calculation step S255.

The reduction in power obtained using the CVR factor calculated in the step S257 of calculating the reduction in power using a CVR factor may correspond to a first voltage output of the first voltage calculation step S250.

The voltage regulator module 100 or the voltage regulator 130 according to the present disclosure may use a winding-type tap change method using, for example, an on-load tap changer (OLTC), or a hybrid semiconductor-type voltage regulation method.

According to the former method, there are limitations in predicting or estimating at least one of a first voltage, a reduction in line power, a second voltage, a predicted voltage, and a target voltage from the power data of the voltage regulator module 100 according to the present disclosure collected in real time and applying minute values of the predicted or estimated voltages.

The latter may include a hybrid semiconductor-type voltage regulator including a plurality of power semiconductor devices, by which the manager or operator of the voltage regulator module 100 may extend a controllable voltage coverage while maintaining a contracted range of voltage fluctuation rates. The voltage regulator module 100 or voltage regulator 130 according to the present disclosure may collectively refer to semiconductor electrical circuits, may be a feedback controller, or may be at least one or a combination of proportional, integral, and differential controllers.

In the hybrid semiconductor-type voltage regulation method, the voltage regulator module 100 or the voltage regulator 130 according to the present disclosure may have a structure able to reduce a lower level and obtain an optimal power density to control voltages, may convert a portion of entire power in an AC-DC-AC process, and may control a voltage, current, and a power factor by means of a power converter without using a tap changer. In addition, each of the voltage regulator module 100 and the voltage regulator 130 is not related to the concept of lifetime regarding the number of voltage changes and may be controlled in real time by a digital signal processor (DSP). Thus, each of the voltage regulator module 100 and the voltage regulator 130 may be suitable for controlling a multi-level power system comprised of higher and lower layers.

Thus, when the voltage regulator module 100 or the voltage regulator 130 uses the latter hybrid semiconductor-type voltage regulation method, the voltage and/or power may be very precisely controlled by a minute value, for example, 0.1%. Such precise voltage control is associated with analysis of the load-specific power data and calculation of the target voltage. Thus, even a complicatedly-branched power system including the multi-stage voltage regulation modules such as the upstream voltage regulation module 110 and the downstream voltage regulation modules 120 may perform voltage/power control without quality degradation.

A voltage control device according to the present disclosure will be described with reference to FIGS. 1 and 2.

Figure 1:
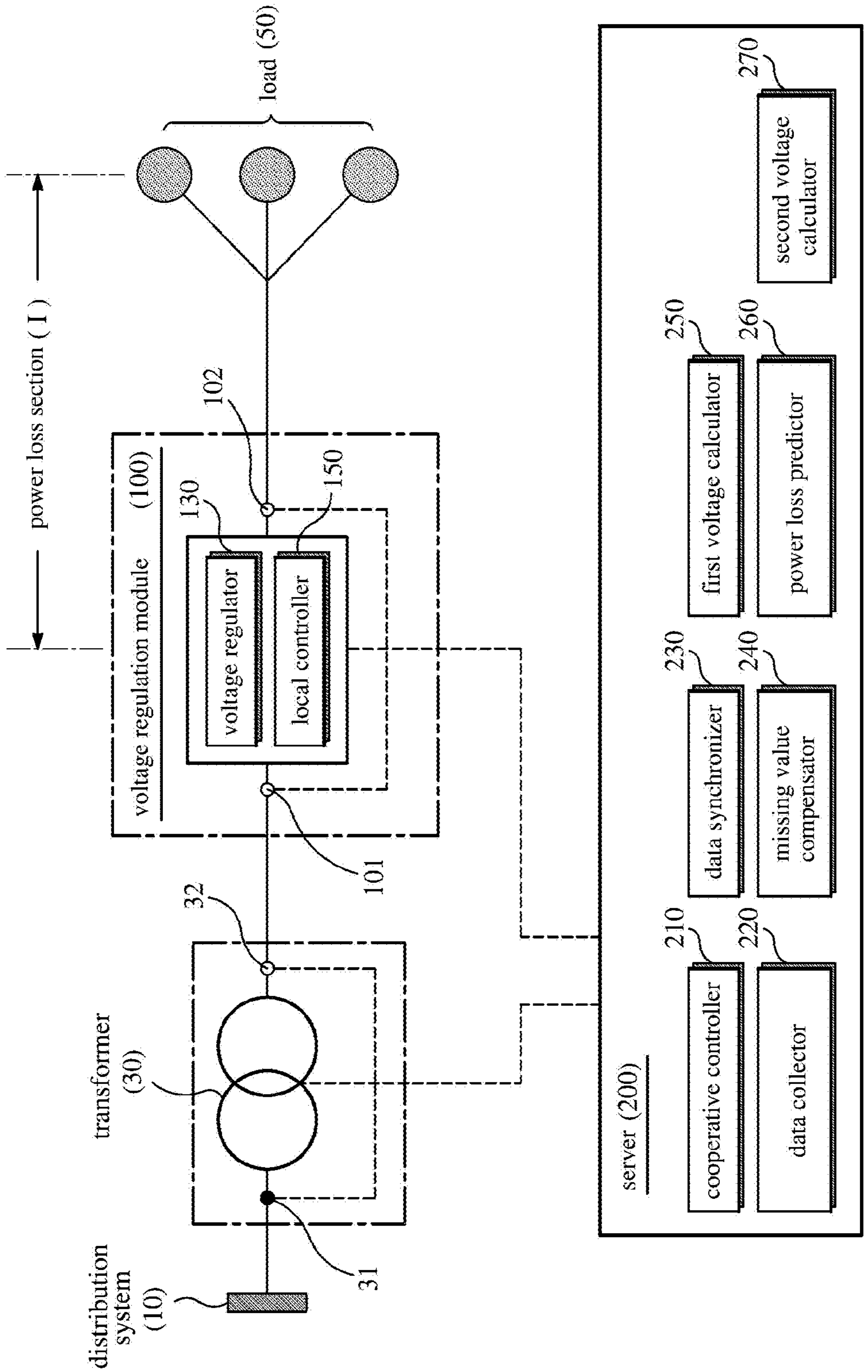
FIG. 1 is a conceptual diagram illustrating the structure of a voltage control device according to the present disclosure.
Figure 2:
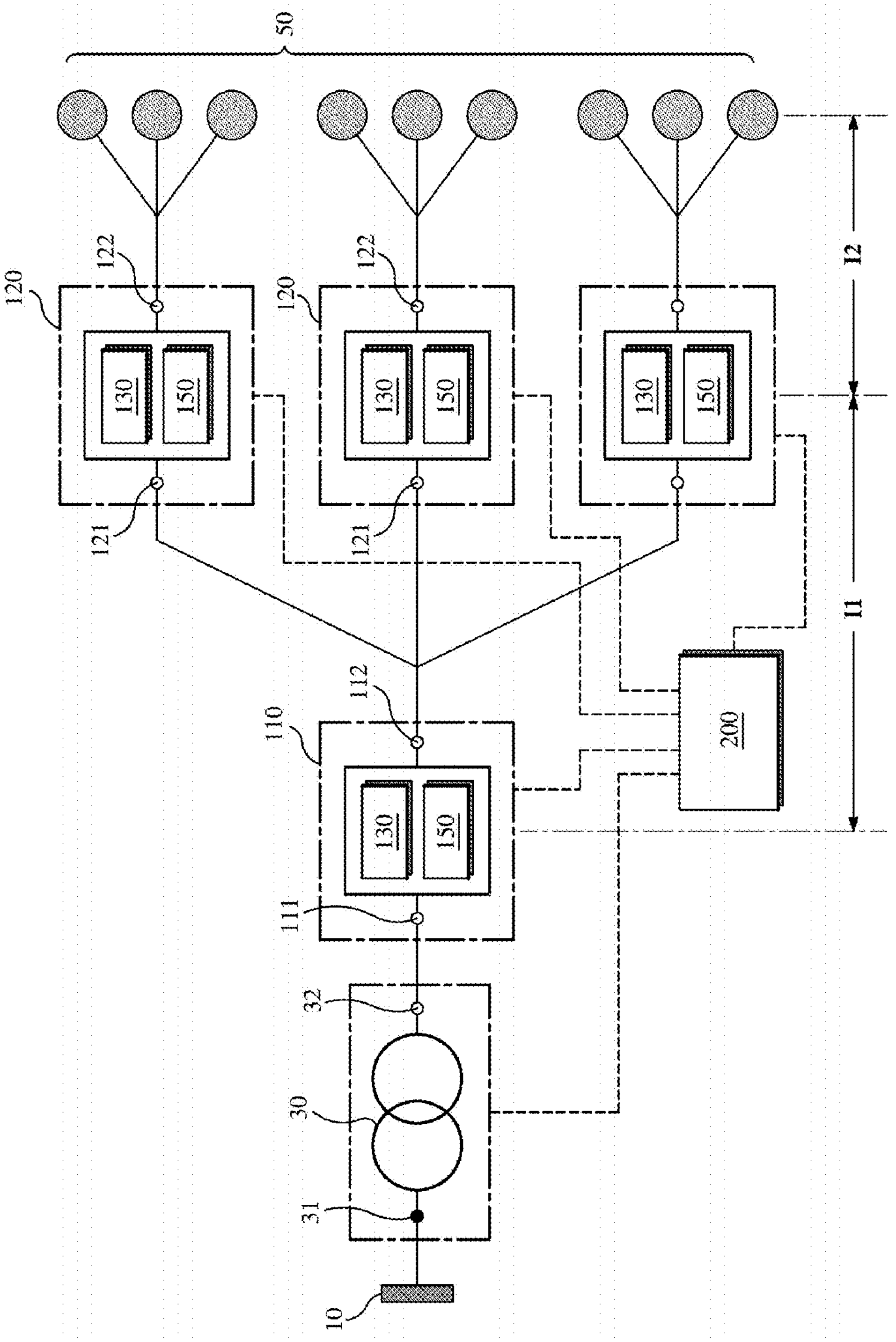
FIG. 2 illustrates an embodiment of FIG. 1.

FIG. 1 illustrates a basic unit structure of the voltage regulator module 100 according to the present disclosure provided between a transformer 30 and the loads 50 in a power system (or distribution system) 10, and FIG. 2 illustrates an embodiment of a plurality of voltage regulator modules 100 in a power system branched into multiple layers.

In FIGS. 1 and 2, the voltage regulator module 100 is illustrated as being located downstream of the power system 10 in consideration that voltage control or regulation according to the present disclosure is performed in an area adjacent to the loads 50. However, herein, a distribution relay, a power system, and a grid may be interchanged with one another depending on circumstances.

The loads 50 may include not only power consuming entities including electric motors in plants, industrial equipment such as an electric furnace, lighting equipment, office equipment, home appliances, and the like, but also power supplying entities able to reversely transmit electricity to the power system 10 and serving as distributed power sources such as a photovoltaic power system, an electric vehicle charger, and an energy storage system (ESS). The loads 50 may be interchanged with nodes, since the loads 50 may be branched into multiple layers as illustrated in FIG. 2.

The voltage control device according to the present disclosure may include the voltage regulator module 100 disposed in the power system 10 to regulate voltages supplied to the loads 50 or reversely transmitted from the loads 50 and a server 200 remotely transmitting or receiving power data to or from the voltage regulator module 100.

Here, the power data of the voltage regulator module 100 may include data related to power input to or output from the voltage regulator module 100 or power data related to the loads 50 located downstream of the corresponding voltage regulator module 100.

In addition, the power data may include not only power as typical meaning of the product of current and voltage, but also all data of the voltage control device generated by flow of current such as a voltage, current, a voltage regulator conversion point, reactive power, and a power factor.

The voltage regulator module 100 may include the voltage regulator 130, a local controller 150, and/or measurement points 101 and 102.

The voltage regulators 130 may receive optimal target voltages from the server 200 or a cooperative controller 210. The target voltages sent to the voltage regulators 130 may be set differently depending on the voltage regulators 130 according to the arrangement of the loads 50 and the branched structure of the loads 50.

The term "optimal" used herein may indicate that the operator or manager of each of the loads 50 may reduce the electricity rate as much as possible by reducing power or electricity as much as possible.

At the measurement point 101 or 102 of the voltage regulator module 100, power data input to the voltage regulator module 100 from an external source or power data output from the voltage regulator module 100 may be measured.

The measurement point 101 or 102 of the voltage regulator module 100 is a point subject to voltage regulation by the voltage regulator module 100, and may be a point at which the predicted or calculated target voltage is realized.

The measurement point 101 or 102 of the voltage regulator module 100 may be included in the voltage regulator 130 or disposed separately from the voltage regulator 130 in terms of the concept thereof.

In a structure in which the measurement point of the voltage regulator module 100 is disposed in the voltage regulator 130, the measurement point may be disposed on an input terminal or an output terminal of the voltage regulator 130. When the measurement point of the voltage regulator module 100 is disposed separately from the voltage regulator 130, a sensor able to collect power data or the like may be disposed at the measurement point of the voltage regulator module 100.

Hereinafter, the term "subject to voltage regulation" at measurement points 31 and 32 of the transformer 30 or the measurement points 101 and 102 of the voltage regulator module 100 may indicate that when the measurement points are included in terminals of the voltage regulator 130, the measurement points are directly subject to voltage regulation, and when the measurement points are disposed separately from and spaced apart from the voltage regulator 130, the voltage regulator 130 is controlled to have a target voltage instructed by the cooperative controller 210 or the server 200 so that an effect occurs at the measurement points due to the control. Unless stated otherwise, the measurement points will be described using the latter meaning. When it is not necessary to clearly distinguish between the measurement points and the voltage regulator 130, the measurement points may be expanded to the former meaning.

The measurement points of the voltage regulator module 100 may include the first measurement point 101 or the second measurement point 102. The first measurement point 101 may be located upstream of the voltage regulator module 100 with respect to the power system (or distribution system) 10.

When communication between the voltage regulator module 100 and the server 200 is determined to be lost in a communication connection status check step S120, a local controller 150 may be converted to a local automatic operation mode S140. In the local automatic operation mode S140, the local controller 150 may locally operate the voltage regulator module 100 in which the corresponding local controller 150 is disposed while the communication is lost.

When converted to the local automatic operation mode S140 in response to the communication with the server 200 being lost, the local controller 150 may determine the direction in which power flowing through the corresponding voltage regulator module 100 is transmitted and thus determine the position of the measurement point subject to voltage regulation.

In an embodiment, when the power factor from the power data of the corresponding voltage regulator module 100 is a positive number, the local controller 150 may determine the direction of power is a forward direction (from the first measurement point 101 to the second measurement point 102). When the power factor is a negative number, the direction of power may be determined to be a reverse direction (from the second measurement point 102 to the first measurement point 101).

When the measurement point subject to voltage regulation is determined, the local controller 150 may perform voltage regulation for the measurement point according to a predetermined reference voltage or a reference value or suspend or stop the voltage regulation for the measurement point already subject to or supposed to be subject to voltage regulation.

The voltage regulation of the local controller 150 according to the predetermined reference voltage or the operation of the local controller 150 stopping the voltage regulation may vary depending on the type of the load 50.

In a case in which the load 50 disposed downstream of the voltage regulator module 100 subject to voltage regulation is only configured to consume power, when the transmission is determined to be forward transmission because, for example, the power factor is a positive number, the local controller 150 may perform the voltage regulation for the second measurement point 102 according to the predetermined reference voltage. When the transmission is determined to be reverse transmission because, for example, the power factor is a negative number, the local controller 150 may stop the voltage regulation for the second measurement point 102.

In the predetermined reference voltage, a power drop due to CVR or a power loss due to a line loss may be reflected.

In a case in which the load 50 disposed downstream of the voltage regulator module 100 subject to voltage regulation is only configured to reversely transmit power because of, for example, power production or charging, when the transmission is determined to be forward transmission because, for example, the power factor is a positive number, the local controller 150 may stop the voltage regulation for the second measurement point 102. When the transmission is determined to be reverse transmission because, for example, the power factor is a negative number, the local controller 150 may perform the voltage regulation for the first measurement point 101 according to the predetermined reference voltage. In this case, the voltage of the first measurement point 101 may be increased by reflecting the power loss due to a line loss.

In a case in which the load 50 disposed downstream of the voltage regulator module 100 subject to voltage regulation is able to reversely transmit power because of, for example, power production or charging while being configured to consume power, while communication with the server 200 is lost, when the transmission is determined to be forward power transmission, the local controller 150 may stop the voltage regulation for the first measurement point 101 and perform the voltage regulation for the second measurement point 102 according to the predetermined reference voltage. When the transmission is determined to be reverse power transmission, the local controller 150 perform the voltage regulation for the first measurement point 101 according to the predetermined reference voltage and stop the voltage regulation for the second measurement point 102.

The term "upstream" or "downstream" may be determined on the basis of the branched structure of the power system 10 extending from a power supplier such as Korea Electric Power Corporation (KEPCO) to the loads 50 at ends, instead of being based on the flow of power. This is because the loads 50 according to the present disclosure include structures such as distributed power sources able to reversely supply power to the power system 10 while consuming power.

Thus, the first measurement point 101 may be interchanged with the upstream measurement point, the measurement point located upstream, the upstream measurement point of the voltage regulator module 100, or the like. The second measurement point 102 may be interchanged with the downstream measurement point, the measurement point located downstream, the downstream measurement point of the voltage regulator module 100, or the like.

Figure 4A:
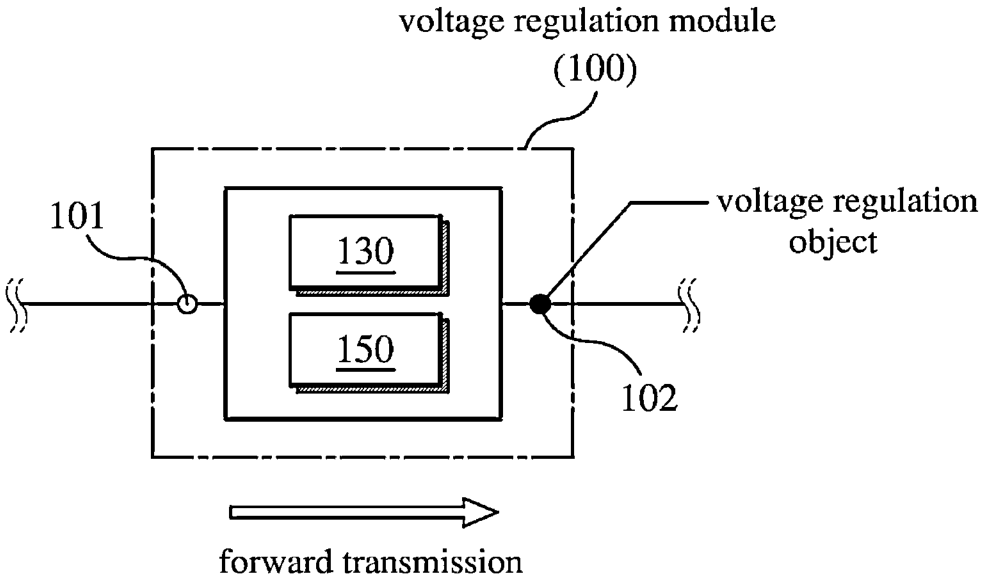
FIGS. 4A and 4B are a diagram illustrating measurement points of the voltage regulator module according to the present disclosure, subject to voltage regulation according to the power flow.
Figure 4B:
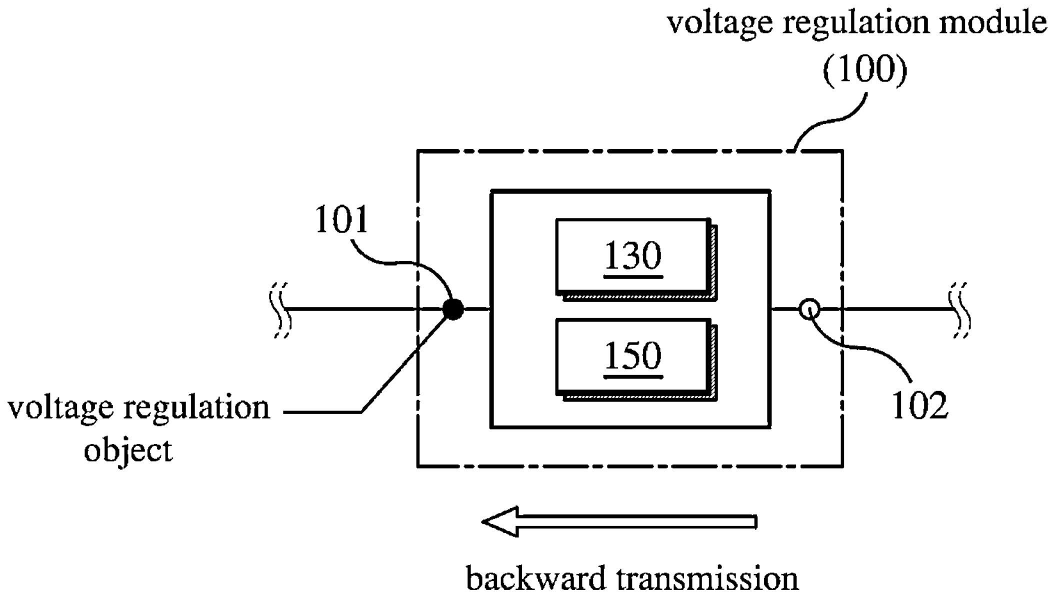

Referring to FIGS. 4A and 4B, when power is transmitted forward from the upstream to the downstream of the power system 10, the second measurement point 102 may be subject to voltage regulation by the voltage regulator module 100. In contrast, in the case of reverse power transmission from the downstream to the upstream of the power system 10, the first measurement point 101 may be subject to voltage regulation by the voltage regulator module 100.

Thus, the measurement points essentially required may vary depending on the type of the loads 50.

In the case of the voltage regulator module 100 in which the loads 50 only consuming power are disposed downstream, only the second measurement point 102 subject to voltage regulation may be sufficient.

In contrast, when the loads 50 including a renewable energy power system, such as a photovoltaic power system or a wind power system, supplying power to the voltage regulator module 100 are disposed downstream of the voltage regulator module 100, only the first measurement point 101 may be sufficient.

In addition, when the loads 50, such as an electric vehicle charger, requiring power data collection and voltage control for forward power transmission and reverse power transmission are disposed downstream of the voltage regulator module 100, the first measurement point 101 or the second measurement point 102 may be included.

The measurement point may be described on the basis of the fact that information regarding the power data input to or output from not only the measurement point but also the voltage regulator 130 may also be collected and transmitted to the server 200. When the voltage regulator 130 does not have the function of collecting the power data input to or output from the voltage regulator 130 or transmitting the power data, both the first measurement point 101 and the second measurement point 102 may be essential components. Since the output voltage is regulated to be the target voltage in comparison to the voltage input to the voltage regulator 130, a comparison target is required.

The first measurement point 31 of the transformer 30 may be provided upstream of the transformer 30, or the second measurement point 32 of the transformer 30 may be provided downstream of the transformer 30.

The transformer 30 according to the present disclosure may indicate a substation in a situation in which high-voltage electricity supplied by KEPCO is supplied to the loads 50, such as houses and plants, through multi-stage substations. That is, the transformer 30 illustrated in the figures may indicate a substation as a public facility rather than being an object controlled by the voltage control device according to the present disclosure.

The meaning and expression of the measurement points 101 and 102 of the voltage regulator module 100 may be equally applied to the measurement points 31 and 32 of the transformer 30. However, the measurement points 31 and 32 of the transformer 30 may differ from the measurement points 101 and 102 of the voltage regulator module 100 in that none of the measurement points 31 and 32 are subject to voltage regulation to the target voltage.

Although none of the measurement points 31 and 32 are subject to voltage regulation to the target voltage by the cooperative controller 210, power data at the measurement points 31 and 32 of the transformer 30 may be collected and transmitted to the server 200 or the cooperative controller 210.

The measurement points 31 and 32 of the transformer 30 may serve as reference points at which a data synchronization step S210 of power data is performed before comparison or analysis of the voltage regulator module 100 located downstream of the transformer 30.

In particular, the first measurement point 31 of the transformer 30 may be the reference point of the power data synchronization step S210. A potential transformer (PT) available for common use is provided on the first side of a transformer of a typical power substation (or power receiving/distributing equipment). When a line is connected or a sensor is attached to the potential transformer, the first measurement point 31 serving as the upstream measurement point of the transformer 30 may be formed in a simple manner.

Thus, the measurement points 101 and 102 of the regulator module 100 are the measurement points subject to voltage regulation illustrated in FIGS. 4A and 4B, from which the measurement points 31 and 32 of the transformer may be excluded.

The voltage control device and the voltage control method according to the present disclosure may consider the reduction in power due to CVR (in S250) or a line loss due to the line resistance (in S270) in order to calculate a target voltage by which the electricity rate may be reduced as much as possible (in S290).

The line loss considered in calculation of the target voltage may relate to a power loss zone I between the voltage regulator module 100 and the loads 50.

When the loads 50 connected to the downstream of the voltage regulator module 100 subject to control consume power, the power loss zone I may range from the voltage regulator module 100 to the loads 50 connected to the downstream of the voltage regulator module 100. Here, an object, the voltage of which is supposed to be regulated according to the target voltage, may be the second measurement point 102 forming the downstream measurement point of the voltage regulator module 100. More particularly, the power loss zone I may be a line zone ranging from the second measurement point 102 to the loads 50.

The line power loss of a power loss predictor 260 may relate to a power loss zone corresponding to at least a portion of lines of a distribution system or power system.

In this case, a power reduction (i.e., a first voltage) due to CVR or a power loss due to a line loss may be applied to the second measurement point 102.

The Power reduction due to CVR may be a voltage drop within the power tolerance (or tolerance) of the downstream loads 50, more particularly, to a voltage (i.e., the first voltage) close to the V lower limit, i.e., the lower limit of the tolerance.

Figure 5A:
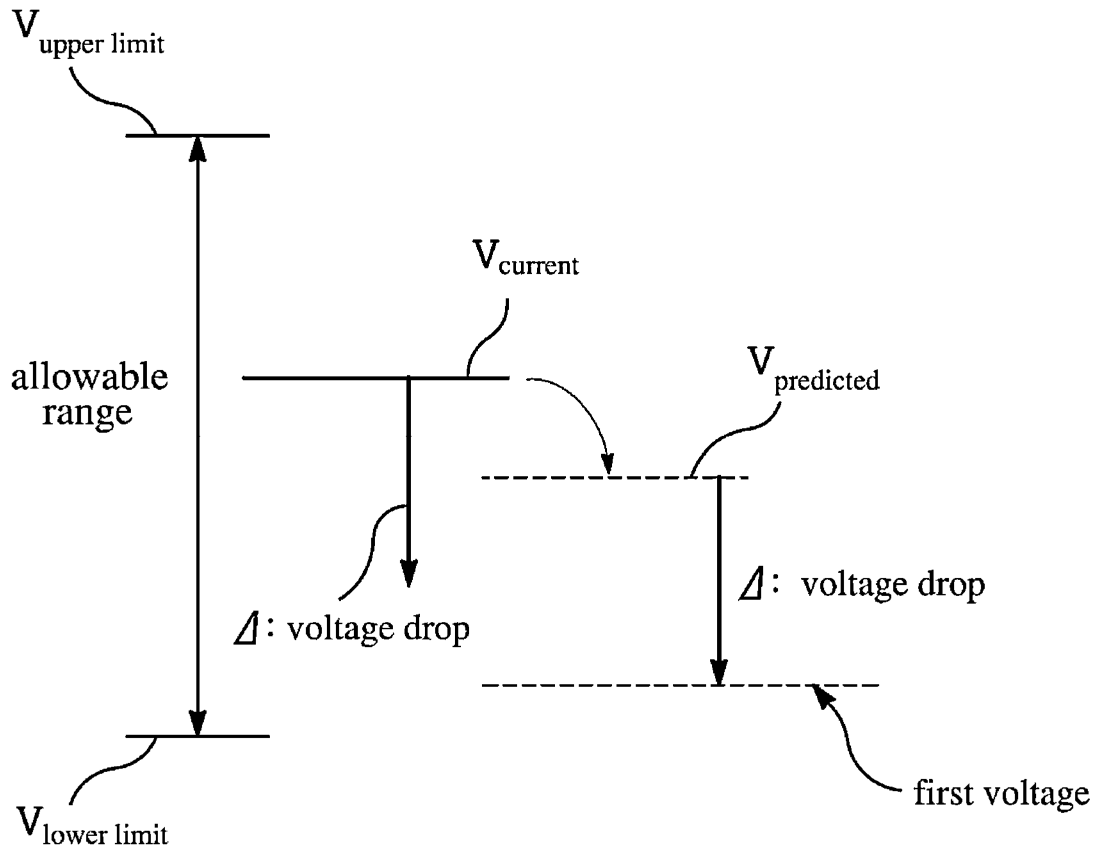
FIGS. 5A and 5B illustrate a first voltage and a second voltage according to the present disclosure.
Figure 5B:
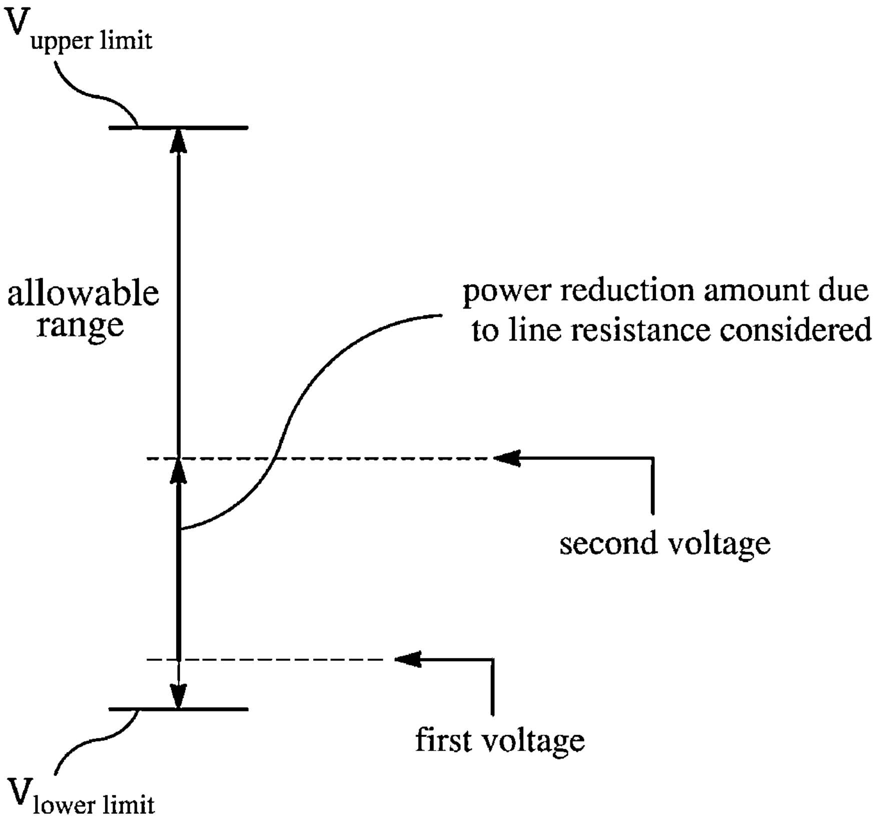

Referring to FIGS. 5A and 5B, the power loss due to a line loss is proportional to the square of a voltage. The power loss may increase with increases in the voltage. Thus, the higher the voltage drop due to CVR, the greater the power loss may be. In an overall aspect, a power reduction effect or an electricity rate reduction effect may be decreased.

Thus, in consideration of the power loss due to a line loss, it may be the same as calculating a voltage (i.e., a second voltage) modified by adding a voltage increase effect in which the power loss due to a line loss is reflected to the voltage drop (i.e., the first voltage) in which the power reduction due to CVR is reflected.

In a case in which the loads 50 consume power, the second measurement point 102 is subject to voltage regulation. The voltage drop in which the power reduction due to CVR is reflected or the voltage increase in which the power loss due to a line loss is reflected may be applied to the second measurement point 102.

Power supplied to the upstream of a voltage regulator module 100 connected to loads 50 serving as distributed power sources may be supplied to another voltage regulator module 100 to which loads 50 required to receive power.

Thus, in a case in which the loads 50 connected to the voltage regulator module 100 subject to control reversely supply power to the power system 10, the power loss zone I may indicate a zone ranging from the first voltage regulator module to the loads 50 through a second voltage regulator module. More specifically, the power loss zone I may be a zone ranging from the first measurement point 101 of the first voltage regulator module to the loads 50 located downstream of the second voltage regulator module.

In a case in which the loads 50 reversely supply power to the power system 10, the first measurement point 102 may be subject to voltage increase to reduce the power loss due to a line loss. In the first measurement point 102 of this case, the voltage drop in which the power reduction due to CVR is reflected may not be considered.

In a case in which the loads 50 simultaneously consume power and supply power, in the case of forward power transmission, the power loss zone I may be a zone ranging from the voltage regulator module 100 to the downstream loads 50 thereof. In the case of reverse power transmission, the power loss zone I may be a zone ranging from the corresponding voltage regulator module 100 to the loads 50 located downstream of another voltage regulator module 100.

In this case, in the voltage regulator module 100, both the first measurement point 101 and the second measurement point 102 are subject to voltage regulation. The voltage drop in which the power reduction due to CVR is reflected or the voltage increase in which the power loss due to a line loss is reflected may be applied to the second measurement point 102. The voltage increase for reducing the power loss due to a line loss is applied to the first measurement point 101. The voltage drop in which the power reduction due to CVR is reflected may not be considered.

Referring to FIG. 2, when the power system is complicatedly branched, the voltage regulator module 100 may be branched into multi-stage layers. The voltage regulator module 100 may include the upstream voltage regulation module 110 or the downstream voltage regulator modules 120. Features of the branched structure of the power system may be commonly applied to the upstream or the downstream, in the same manner as in the description of the measurement point.

An object subject to voltage regulation by the upstream voltage regulation module 110 is a second measurement point 112 of the upstream voltage regulation module 110 in the figure. However, since FIG. 2 illustrates a simple embodiment of the multi-stage structure, when the power system is complicatedly branched, the first measurement point 111 of the upstream voltage regulation module 110 may also be subject to voltage regulation due to reverse transmission.

Voltage control of the upstream voltage regulation module 110 may be determined by considering voltage control of the downstream voltage regulator module 120 located downstream thereof. In a case in which a voltage increase is predicted in a first downstream voltage regulator module but a voltage drop is predicted in a different second downstream voltage regulator module, the voltage control of the upstream voltage regulation module 110 may vary depending on the degree of the voltage drop and the degree of the voltage increase of the two downstream voltage regulator modules.

The server 200 may receive power data from the upstream voltage regulation module 110 or the downstream voltage regulator modules 120 and transmit a calculated or predicted target voltage thereto. In the voltage control of the upstream voltage regulation module 110, not only information regarding the downstream voltage regulator modules 120 located downstream of the upstream voltage regulation module 110 may be required but also one of the downstream voltage regulator modules 120 may be connected to the loads 50 capable of reverse transmission. In this case, power data of another downstream voltage regulator module may be used to determine the degree by which the voltage is to be controlled and increased by the corresponding downstream voltage regulator module 120.

When the voltage regulator module 100 is comprised of upstream and downstream multi-stage layers, the power loss zone I may also be classified in multiple stages. In this case, the power loss zone I may include a first power loss zone I1 and a second power loss zone I2.

The first power loss zone I1 may be a zone ranging from the upstream voltage regulation module 110 to the downstream voltage regulator modules 120.

When the loads 50 consume power, the second power loss zone I2 may be a zone ranging from the downstream voltage regulator modules 120 to the loads 50 connected to the downstream of the downstream voltage regulator modules 120. When the loads 50 reversely transmit power, the second power loss zone I2 may be a zone ranging from a first downstream voltage regulator module 120 to the loads **50*a* connected to a second downstream voltage regulator module 120 through the second downstream voltage regulator module 120**.

In a case in which the loads 50 capable of power consumption and power reverse transmission are connected to the first downstream voltage regulator module 120, when forward power is transmitted to the first downstream voltage regulator module 120, the second power loss zone I2 may be a zone from the first downstream voltage regulator module 120 to the loads 50 connected to the downstream thereof. When reverse power is transmitted to the first downstream voltage regulator module, the second power loss zone I2 may be a zone ranging from the first downstream voltage regulator module to the loads connected to the second downstream voltage regulator module through the second downstream voltage regulator module.

Both a voltage drop due to CVR and a voltage increase due to a line power loss in which the first power loss zone I1 and the second power loss zone I2 are reflected may be applied to the second measurement point 112 of the upstream voltage regulation module 110, in consideration of the downstream voltage regulator module 120 and the loads 50 connected thereto.

The degree of concentration of each of the voltage drop due to CVR and the voltage increase due to a line power loss may vary according to the layers of the voltage regulator module, depending on the branched structure of the power system, the distances between the voltage regulator modules 100, the distances between the voltage regulator module 100 and the loads 50, or the like. For example, the voltage increase due to a line loss may be further concentrated in the upstream voltage regulation module 110, while the voltage drop due to CVR may be further concentrated in the downstream voltage regulator module 120.

The voltage control device according to the present disclosure may include at least one of the cooperative controller 210, the data collector 220, a data synchronizer 230, a missing value compensator 240, a first voltage calculator 250, a power loss predictor 260, and a second voltage calculator 270.

The data collector 220 may receive power data transmitted from the transformer 30 (including the measurement points 31 and 32) or the voltage regulator module 100 (including the measurement points 101 and 102, the voltage regulator 130, and the local controller 150) and collect or store the power data.

The power data collected from the transformer 30 or the voltage regulator module 100 may be collected in the basic unit of second, minute, hour, or the like in a time series manner.

A vast amount of power data of the transformer 30 or the voltage regulator module 100 collectable per second may be used by the first voltage calculator 250, the power loss predictor 260, the second voltage calculator 270, a predicted voltage $V_{predicted}$ calculator (when provided separately from the cooperative controller), or the like in calculation or prediction on the basis of artificial intelligence (AI) technology of machine learning or the like according to the present disclosure. Thus, the target voltage of the voltage regulator module 100 according to the present disclosure may be calculated in real time. Consequently, an electricity rate reduction may be calculated (in S400), and an electricity rate reduction report may be written in real time and provided (in S500).

The cooperative controller 210 may send an instruction to each of the voltage regulator modules 100 so that voltage regulation is performed according to the target voltage calculated using the power data of the data collector 220.

The cooperative controller 210 may calculate the predicted voltage $V_{predicted}$ of each of the voltage regulator modules 100 and the loads 50 each connected to the corresponding voltage regulator module 100 on the basis of the power data of the data collector 220. A predicted voltage calculator calculating a predicted voltage by finding the tendency of changes from past power data to present power data may be provided separately.

The present disclosure may be based on the predicted voltage $V_{predicted}$ calculated by the cooperative controller 210 or the predicted voltage calculator in order to calculate the target voltage in which, for example, the voltage drop or the voltage increase of the voltage regulator module 100 (or the measurement points 101 and 102) is reflected.

The voltage control device according to the present disclosure may achieve voltage stabilization by predicting the future voltage in order to minimize losses due to a low voltage and an overvoltage caused by the voltage regulation based on the current voltage.

The voltage control device according to the present disclosure predicts a future voltage pattern by predicting the voltage of each of the nodes (i.e., loads 50) and then estimates the dropped or increased target voltage. Finally, the cooperative controller 210 may control the voltage regulator 130 according to the target voltage.

FIGS. 5A and 5B illustrate a process of calculating a first voltage in the order from 5A to 5B and calculating a second voltage modified by reflecting a power loss due to a line loss to the first voltage. This may relate to the target voltage of the second measurement point 102 of the voltage regulator module 100 in a case in which the loads 50 consume power.

Whether one of a voltage drop due to CVR in FIG. 5A and a voltage increase for reducing a line loss in FIG. 5B is to be applied or both the voltage drop and the voltage increase are to be applied may be determined depending on the type of the loads 50.

When the loads 50 reversely transmit power to the power system, the voltage increase for reducing a line loss in FIG. 5B may be applied to the first measurement point 101 of the voltage regulator module 100, without application of the voltage drop due to CVR in FIG. 5A.

Here, the power loss due to a line loss may be calculated on the basis of the predicted voltage $V_{predicted}$. The second voltage in this case may be the target voltage calculated by only considering the power loss due to a line loss, instead of being modified on the basis of the first voltage.

When the loads 50 may perform both forward transmission and reverse transmission, only the voltage increase for reducing a line loss may be applied to the first measurement point 101 of the voltage regulator module 100, without application of the voltage drop due to CVR. Here, both the voltage drop due to CVR and the voltage increase for reducing a line loss in FIG. 5B may be applied to the second measurement point 102.

In order to calculate the target voltage using the power data transmitted from the voltage regulator module 100 including at least one of the measurement points 101 and 102, the voltage regulator 130, and the local controller 150, the data synchronizer 230 may synchronize the power data of the voltage regulator modules 100.

When the loads downstream of the voltage regulator module 100 and subject to voltage regulation have a relatively simple branched structure, synchronization by the data synchronizer 230 may be omitted or be merely reviewed. Recently, as the type of the loads 50 is becoming more complicated due to, for example, power consumption, reverse transmission, or a combination thereof, the branched structure of loads is also becoming more complicated. In this case, before prediction of power or calculation/prediction of a power reduction or a power loss is performed using the power data, power data synchronization may be necessary.

A reference point of the power data synchronization is necessary. The transformer 30 or the measurement points 31 and 32 of the transformer may be used as the reference point. When the power system branched structure downstream of the transformer 30 is not excessively complicated, power exchange or power storage using equipment such as an ESS within the downstream of the transformer 30 may be more efficient than reverse power transmission to the upstream of the transformer 30. Thus, the transformer 30 may be regarded as a branch point to act as a reference for the data synchronization of the plurality of voltage regulator modules 100 downstream of the transformer 30.

In addition, a potential transformer (PT) available for common use is provided on the first side of a transformer of a typical power substation (or power receiving/distributing equipment). Thus, there is an advantage in that a supplier operating the voltage control device according to the present disclosure may simply collect the power data of the transformer by connecting or attaching a line to the first side of the transformer. Accordingly, the first measurement point 31 that is the upstream measurement point of the transformer 30 may act as a reference point for the data synchronization.

First, the data synchronizer 230 may perform time synchronization to the power data collected from the transformer 30 or the voltage regulator module 100. Second, the data synchronizer 230 may perform phase synchronization to the power data or the like. When the power system has a simple branched structure, the time synchronization may be sufficient. However, when the branched structure is complicated, even in the case that the power data is synchronized according to the time series, a time delay may occur due to, for example, slightly different measurement time points, thereby causing a phase delay in the power data. In this case, the second phase synchronization of the power data may be required.

Before the target voltage or the like is predicted or calculated using the power data of the voltage regulator module 100, the missing value compensator 240 may process a missing value or a null value. The missing value may include Not Available (NA), Not a Number (NaN), or Null.

The missing value compensator 240 may fill or substitute the missing value with a value predicted or estimated using a machine learning model including a regression model or the like.

When the power data of the voltage regulator module 100 has a missing value, the missing value compensator 240 may estimate/predict the missing value from data, from which the missing value is excluded, among the power data having the missing value by a learning or training process. Alternatively, the missing value compensator 240 may estimate/predict the missing value using power data of another voltage regulator module 100, except for the power data of the voltage regulator module 100 having the missing value.

The missing value processing by the missing value compensator 240 may be performed after the power data synchronization performed by the data synchronizer 230.

The first voltage calculator 250 may calculate a first voltage in which a reduction in power due to CVR is reflected.

Referring to FIGS. 5A and 5B, each of the loads has a tolerance beyond which the lifetime may be reduced or the possibility of breakdown may increase. The tolerance has an upper limit $V_{upper\ limit}$ and a lower limit $V_{lower\ limit}$ as boundary values. The first voltage calculator 250 set the first voltage to be higher than lower limit $V_{lower\ limit}$ so as to be within the tolerance.

The first voltage calculator 250 may calculate the degree of the voltage drop due to CVR on the basis of the predicted voltage $V_{predicted}$ predicted or calculated by the cooperative controller 210 or the predicted voltage calculator.

The first voltage calculator 250 may perform a voltage drop operation by directly reducing the current voltage $V_{present}$ of the voltage regulator module 100 or reducing the voltage on the basis of the predicted voltage $V_{predicted}$. When the voltage drop operation is performed on the basis of the predicted voltage $V_{predicted}$, the possibility of damage due to a low voltage or an overvoltage may be reduced compared to when the voltage is directly dropped from the current voltage $V_{present}$ of the voltage regulator module 100. Thus, the system may be more reliably operated.

The power loss predictor 260 may predict or calculate a line power loss from the voltage regulator module 100 to the loads 50.

The amount of power lost due to lines may gradually increase according to the degree of voltage drop or the calculated first voltage. That is, the reduction in power due to CVR may increase with increases in the voltage drop due to CVR. In contrast, the power loss due to a line loss may increase with increases in the voltage drop. Consequently, an excessive voltage drop may decrease a power reduction effect against the intention.

Thus, it is necessary for the power reduction due to CVR by the first voltage calculator 250 and the power loss due to a line loss by the power loss predictor 260 to be in harmony with each other.

The second voltage calculator 270 may calculate the second voltage modified by reflecting the power loss of the power loss predictor 260 to the first voltage of the first voltage calculator 250.

Referring to FIGS. 5A and 5B, the first voltage calculator 250 may calculate the voltage drop or the first voltage, by which the power may be reduced as much as possible within the power tolerance, without considering the line loss. The power loss predictor 260 may calculate the power loss due to a line loss from the voltage regulator module 100 subject to the regulation to the loads 50. The second voltage calculator 270 may calculate the second voltage increased from the first voltage by considering a line power loss.

With reference to FIGS. 3 to 8, the voltage control method according to the present disclosure will be described.

Figure 3:
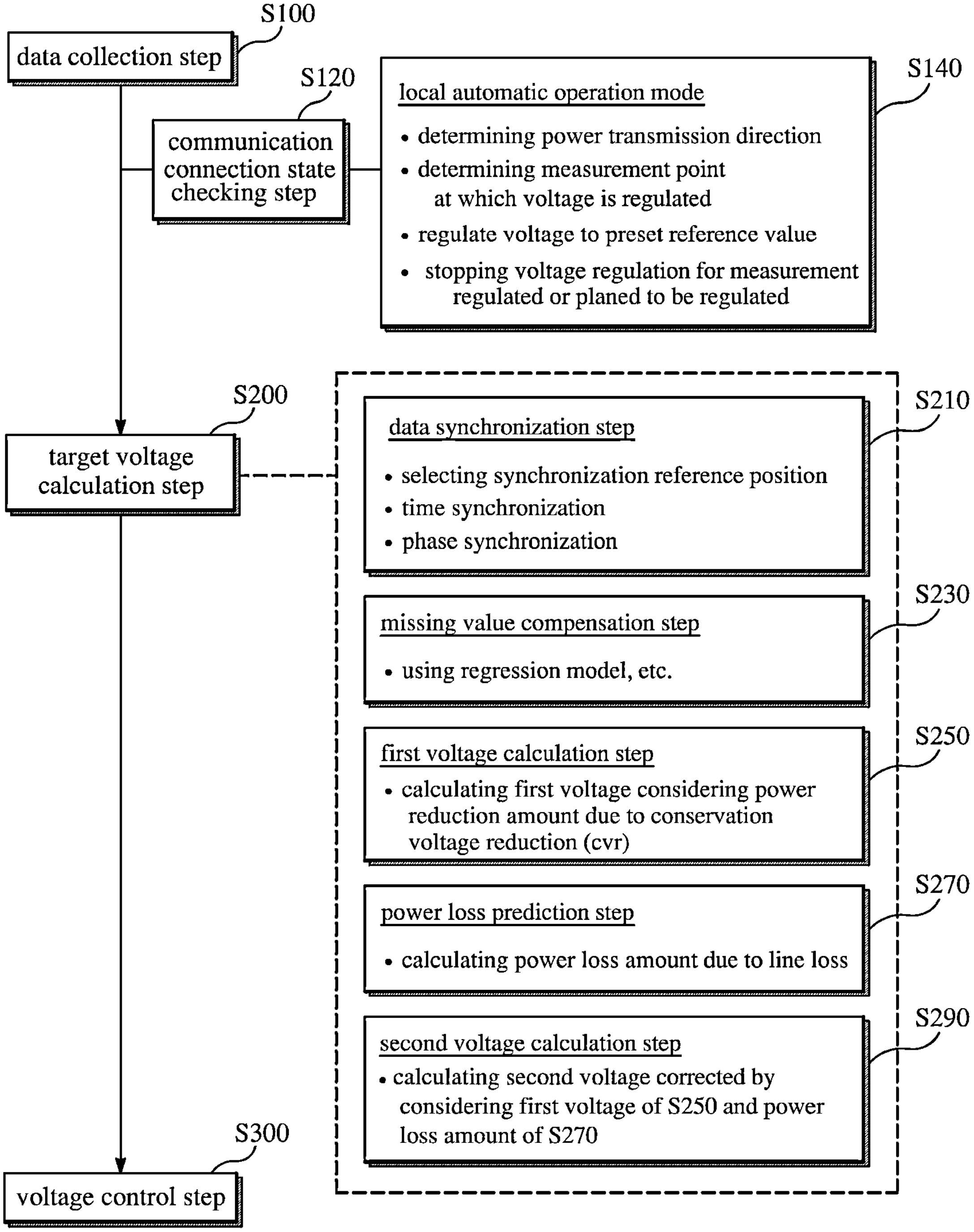
FIG. 3 is a diagram illustrating a voltage control method according to the present disclosure.

Referring to FIG. 3, the voltage control method according to the present disclosure may include at least one of the data collection step S100, the target voltage calculation step S200, a voltage control step S300, an electricity rate reduction calculation step S400, and an electricity rate reduction report providing step S500.

In the data collection step S100, the data collector 220 may receive power data of the transformer 30 or the voltage regulator module 100.

The voltage control method according to the present disclosure may include a communication connection status check step S120 of checking the communication connection status between the voltage regulator module 100 subject to voltage regulation and the server 200.

In the communication connection status check step S120, when the communication between the voltage regulator module 100 and the server 200 is lost, the local controller 150 may perform the local automatic operation mode S140.

In the local automatic operation mode S140, the local controller 150 may determine the direction in which power flowing through the corresponding voltage regulator module 100 is transmitted and thus determine the position of a measurement point at which the voltage is to be regulated.

In the local automatic operation mode S140, the local controller 150 may perform voltage regulation for the measurement point according to a predetermined reference voltage or a reference value or suspend or stop the voltage regulation for the measurement point. This may be determined depending on the type of the loads 50 capable of power consumption or reverse power transmission.

The target voltage calculation step S200 may include at least one of the data synchronization step S210, a missing value compensation step S230, the first voltage calculation step S250, the power loss prediction step S270, and the second voltage calculation step S290.

The target voltage calculation step S200 may be a step of calculating, by the voltage regulator module 100, a target voltage, i.e., a final voltage to be regulated. The target voltage may include a first voltage of the first voltage calculator 250 and a second voltage of the second voltage calculator 270.

In the target voltage calculation step S200, the target voltage may be determined to be at least one of the first voltage in which only a voltage drop of the first voltage calculation step S250 is reflected, a voltage value increased by reflecting the line power loss of the power loss prediction step S270, and a second voltage modified by reflecting the line power loss to the first voltage of the second voltage calculation step S290 according to the type of the loads 50 capable of power consumption or reverse power transmission to the power system, the direction of flow of power, the position of the measurement points 101 and 102 subject to voltage regulation, or the like.

The data synchronization step S210 may be performed as a data preprocessing step prior to the other steps belonging to the target voltage calculation step S200.

In the data synchronization step S210, the data synchronizer 230 may synchronize the power data of a plurality of voltage regulator modules 100.

In the data synchronization step S210, the data synchronizer 230 may perform first processing of time synchronization to the power data collected from the voltage regulator module 100 and second processing of phase synchronization to the power data or the like.

In the data synchronization step S210, the data synchronizer 230 may set a reference point for synchronization of the power data. In particular, the upstream first measurement point 31 of the transformer 30 corresponding to a higher branch point of the plurality of voltage regulator modules 100 may be used as a synchronization reference point.

The missing value compensation step S230 may be performed in prior to the step S250, S270, or S290 of calculating the target voltage.

In the missing value compensation step S230, the missing value compensator 240 may process a missing value of the power data processed in the data synchronization step S210.

In the missing value compensation step S230, the missing value compensator 240 may estimate/predict the missing value from data, from which the missing value is excluded, among the power data having the missing value by a learning or training process using a machine learning model including a regression model or the like, or may estimate/predict the missing value using power data of another voltage regulator module 100, except for the power data of the voltage regulator module 100 having the missing value.

In the first voltage calculation step S250, the first voltage calculator 250 may calculate the first voltage which is within the tolerance. In the first voltage, a reduction in power caused by a voltage drop due to CVR is reflected.

In the first voltage calculation step S250, the first voltage calculator 250 may calculate the first voltage on the basis of the predicted voltage $V_{predicted}$ calculated by the cooperative controller 210 or the predicted voltage calculator. When the voltage drop is determined on the basis of the predicted voltage $V_{predicted}$, the possibility of damage due to a low voltage or an overvoltage may be reduced compared to when the voltage drop is directly performed from the current voltage $V_{present}$. Thus, the voltage control device may be more reliably operated.

In the power loss prediction step S270, the power loss predictor 260 may predict or calculate a line power loss from the voltage regulator module 100 to the loads 50.

The line power loss may also increase with increases in the voltage drop. Thus, in the power loss prediction step S270, the power loss predictor 260 may calculate a line power loss by which the first voltage due to the voltage drop of the first voltage calculation step S250 is increased.

In the second voltage calculation step S290, the second voltage calculator 270 may calculate the first voltage of the first voltage calculation step S250 or the second voltage modified by reflecting the power loss of the power loss prediction step S270.

In the voltage control step S300, the cooperative controller 210 may send the target voltage calculated through at least one of the first voltage calculation step S250, the power loss prediction step S270, and the second voltage calculation step S290 to the voltage regulator module 100 or the voltage regulator 130, or control the voltage of the voltage regulator 130 or the measurement points 101 and 102 according to the target voltage.

After the voltage control step S300, the electricity rate reduction calculation step S400 or the electricity rate reduction report providing step S500 of displaying a gain due to the target voltage to an operator/manager of the voltage control device according to the present disclosure may be performed.

In the electricity rate reduction calculation step S400, an electricity rate reduction calculator 280 may calculate an electricity rate reduced by the target voltage calculated from at least one of the first voltage of the first voltage calculation step S250, the power loss of the power loss prediction step S270, and the second voltage of the second voltage calculation step S290.

For example, an electricity rate reduction may include an average electricity rate reduction obtained by multiplying a time-specific reduction in power with an average electricity rate or a time-specific electricity rate reduction obtained by multiplying the time-specific reduction in power with a time-specific electricity rate.

In the electricity rate reduction report providing step S500, an electricity rate reduction report provider 290 may write a real-time report or a periodic report on the basis of the real-time electricity rate reduction and provide the report to the operator or manager of the voltage control device according to the present disclosure.

Figure 7:
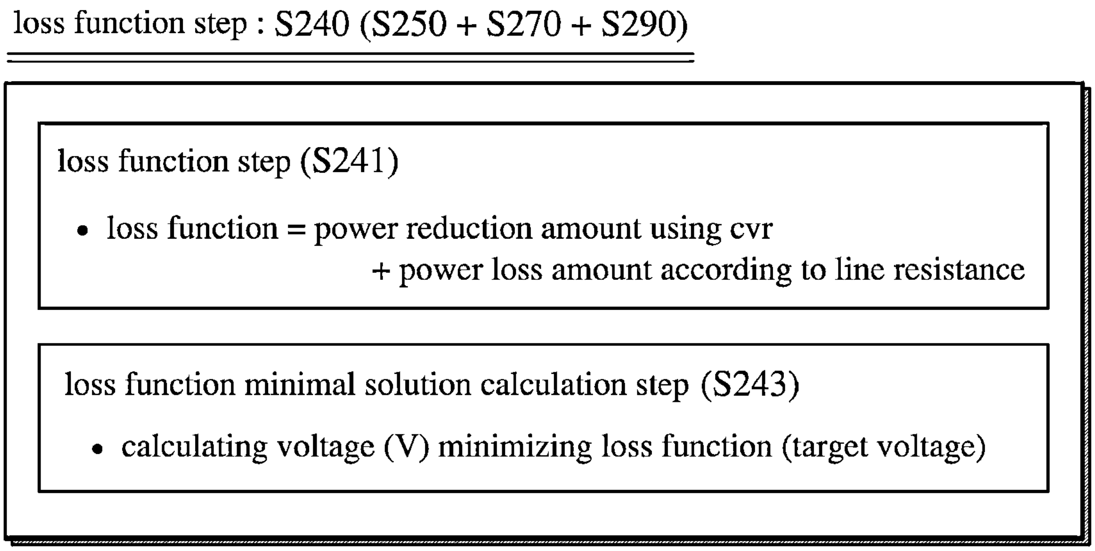
FIG. 7 illustrates the loss function step according to the present disclosure.
Figure 8:
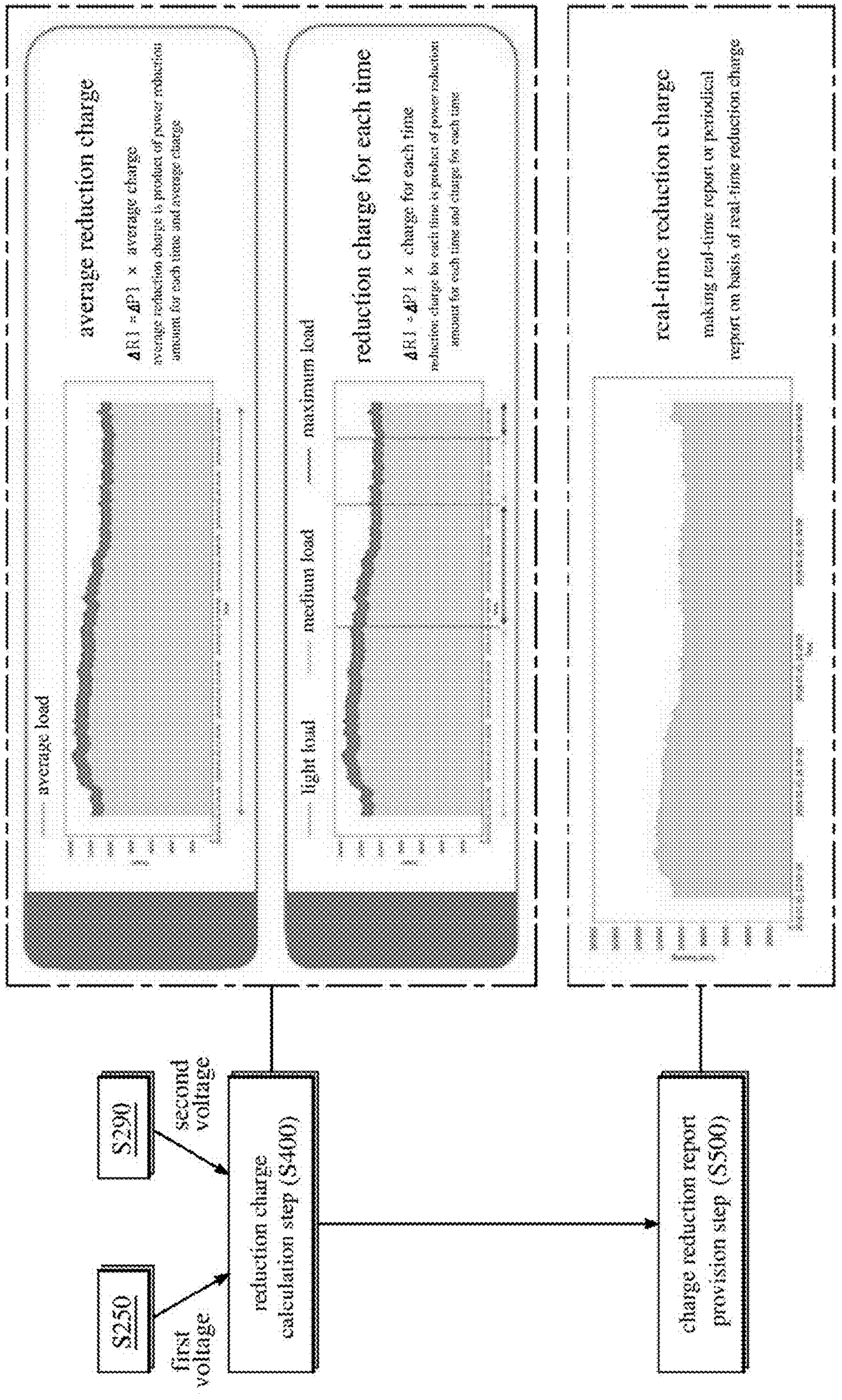
FIG. 8 illustrates an electricity rate reduction calculation step and an electricity rate reduction report providing step according to the present disclosure.

Referring to FIGS. 3 and 7, in the loss function step S240, the cooperative controller 210 may set a loss function indicating the reduction in power or the power loss for the voltage regulator module 100 subject to voltage regulation or the loads 50 connected to the voltage regulator module 100.

The target voltage calculation step S200 of calculating, by the voltage regulator module, the target voltage to be regulated may include the loss function step S240. The loss function step S240 may include a loss function generation step S241 or a loss function minima calculation step S243.

The loss function generation step S241 may be a step of setting or generating, by the cooperative controller 210, the loss function including a first component corresponding to the reduction in power due to CVR or a second component corresponding to the power loss due to a line loss.

In the loss function minima calculation step S243, the loss function is named and a least solution (or minimum) minimizing the power loss is calculated in order to emphasize that the voltage increase due to the line power loss is reflected in the voltage drop due to CVR according to the present disclosure. However, the loss function may be configured to represent the reduction in power from the operator's point of view. In this case, to obtain a solution maximizing the reduction in power is the objective.

Thus, regardless the name, the loss function or the loss function minima calculation step S243 may be configured to represent the power loss and obtain a solution minimizing the power loss, may be configured to represent the reduction in power and obtain a solution maximizing the power reduction, or may obtain respective local maxima or minima. As a result, the loss function or the loss function minima calculation step S243 may be configured to provide the entity operating the voltage regulator module with the target voltage by which the electricity rate may be reduced.

The loss function step S240 may include at least one of the first voltage calculation step S250, the power loss prediction step S270, and the second voltage calculation step S290 to be described below. Features of the first voltage, the power loss due to a line loss, or the second voltage may be applied to the loss function step S240. More specifically, the loss function generation step S241 may include at least one of the first voltage calculation step S250, the power loss prediction step S270, and the second voltage calculation step S290.

The first component of the loss function corresponding to the reduction in power due to CVR may correspond to the first voltage of the first voltage calculation step S250. The second component of the loss function may correspond to the power loss due to a line loss. The first component or the second component may be provided as a function of a voltage or a voltage difference due to a voltage drop.

For example, the first component may be provided as a linear function of a voltage or a voltage difference related to the voltage regulator module 100. The second component may be provided as a quadratic function of a voltage or a voltage difference related to the voltage regulator module 100. In this case, the loss function may be represented by a quadratic polynomial of a voltage or a voltage difference related to the voltage regulator module 100. Thus, minimizing the electricity rate of the voltage regulator module 100 subject to voltage regulation may be the same as obtaining the minimum, the maximum, or a local solution of the loss function represented by a polynomial of the voltage or the voltage difference.

The loss function is obtained by adding the voltage increase effect (i.e., the second component) in which the line power loss is reflected to the reduction in power caused by the voltage drop effect due to CVR (i.e., the first component). Thus, the loss function may indicate the modified reduction in power.

The CVR factor may indicate the ratio of the power fluctuation rate with respect to the voltage fluctuation rate. For example, when power is reduced by 2% in response to the reduction of a voltage by 1% in the same direction, the CVR factor may be 2.

The reduction in power due to CVR ΔP (i.e., the first component) may be calculated by multiplying the voltage difference ΔV with the CVR factor. Since the CVR factor may be set as a constant value previously determined to be an average value or the like from the power data of the voltage regulator module 100, the reduction in power due to CVR (i.e., the first component) may be proportional to the voltage difference ΔV or may be determined by the voltage difference ΔV.

For example, the voltage difference ΔV of the reduction in power due to CVR (i.e., the first component) may indicate the difference $\Delta V=|V_{present}-V_{target}|$ between the current voltage $V_{present}$ and the target voltage $V_{target}$.

Thus, the reduction in power due to CVR (i.e., the first component) may be determined by or depend on a linear expression or a first degree of a voltage (e.g., the target voltage) or a voltage difference (e.g., the difference between the current voltage $V_{present}$ and the target voltage $V_{target}$).

Here, the voltage difference ΔV may be a voltage fluctuation at another time point with respect to the same measurement point of the voltage regulator module 100 subject to voltage regulation. That is, the voltage difference ΔV may correspond to a voltage fluctuation at different time points before and after the voltage fluctuation, with respect to the same voltage regulator module 100 subject to voltage regulation.

The power loss due to a line loss (or the second component) may be a power loss from the voltage regulator module 100 to a power supply point connected thereto along line of the power system.

For example, the power supply point may include a load 50 that consumes power. In this case, the line power loss (i.e., the second component) may be a power loss due to the line length (or the resistance) from the voltage regulator module 100 (more specifically, the measurement point of the voltage regulator module) to the load 50.

When the voltage regulator module 100 is branched into the upstream voltage regulation module 110 and the downstream voltage regulator modules 120, the power supply point may include one or more other voltage regulator modules 110 or 120 or loads 50. Here, the other voltage regulator modules 110 or 120 may include measurement points of the corresponding voltage regulator module. The measurement points may be understood as being provided on the corresponding line through which power is supplied. Final power supply points may be the loads 50. In a multi-stage power supply module structure in which the power system is branched, the upstream voltage regulation module 110 or the downstream voltage regulator modules 120 may serve as intermediate power supply points.

For example, the line power loss ΔP (i.e., the second component) may be calculated by $\Delta V^2/R$, where ΔV is the voltage difference, and R is the line loss. The voltage difference ΔV of the line power loss (i.e., the second component) may indicate the difference between the voltage of the voltage regulator module 100 and the voltage $V_{object}$ of the power supply point. As described above, the power supply point may include the loads 50 or another voltage regulator module 100.

The voltage of the voltage regulator module 100 of the second component may include the target voltage $V_{target}$ to be predicted and regulated by the voltage regulator module 100 according to the present disclosure.

For example, the voltage difference ΔV of the second component may be calculated from the difference between the target voltage $V_{target}$ and the voltage $V_{object}$ of the power supply point: A $V=|V_{target}-V_{object}|$. Thus, the line power loss (i.e., the second component) may be determined by or depend on the square of the target voltage (a quadratic expression) or the square of the voltage difference ΔV in which the target voltage is reflected (a quadratic expression).

Here, the voltage difference ΔV of the second component may be a voltage fluctuation between different points (e.g., the voltage regulator module or the measurement point thereof and the loads thereof) at the same time point. In addition, the target voltage $V_{target}$ in the second component may the voltage of the measurement point provided on the line having a loss among the measurement points 101 and 102 of the voltage regulator module.

As set forth above, the loss function may be represented by a variety of polynomials each including a second expression for the voltage (i.e., the target voltage) or the voltage difference including the target voltage. As a result, an optimal/minimum operating rate may be calculated by obtaining the solution of the loss function represented by a variety of polynomials.

Although the exemplary embodiments of the present disclosure have been described for illustrative purposes, those skilled in the art will appreciate that various modifications, additions, and substitutions are possible, without departing from the scope and spirit of the present disclosure as disclosed in the accompanying claims.

What is claimed is:

1. A voltage control device comprising: a voltage regulator module configured for regulating a voltage supplied to loads or reversely transmitted from the loads; a cooperative controller configured for controlling the voltage regulator module according to a target voltage or sending the target voltage to the voltage regulator module; a conservation voltage reduction (CVR) factor calculator configured for estimating a CVR factor; and a power loss predictor configured for calculating a power loss of a line of a power system, wherein the target voltage is calculated by reflecting a voltage drop due to CVR using the CVR factor, and the CVR factor is estimated in different methods according to at least one of a measurement time, a load state, and a representative value, wherein a reduction in power caused by the voltage drop due to CVR is calculated by multiplying the voltage drop to the target voltage and the CVR factor, and the voltage drop to the target voltage is determined by reflecting the line power loss calculated by the power loss predictor.

2. The voltage control device of claim 1, wherein the estimation of the CVR factor according to the measurement time includes a case in which a specific condition for power data comprising a voltage or power is met, the CVR factor calculator is configured to calculate the CVR factor from a voltage fluctuation or a power fluctuation for a predetermined time before and after a time point at which the specific condition is met, and the estimation of the CVR factor according to the measurement time is able to use the power data or voltage data, and is applicable when there is no data in which an operating time of the voltage regulator module is recorded.

3. The voltage control device of claim 2, wherein the specific condition includes at least one of whether a voltage difference or a power difference is a positive value or a negative value, whether or not the voltage difference or the power difference meets a predetermined range of a minimum value, a maximum value, and the like, and whether or not the CVR factor meets a range of an upper limit or a lower limit.

4. The voltage control device of claim 1, wherein the estimation of the CVR factor according to the measurement time includes a case in which the CVR factor is calculated according to a time at which the voltage regulator module operates, and the CVR factor calculator is configured to estimate the CVR factor from a voltage fluctuation or a power fluctuation before and after a power conversion operating time of the voltage regulator module.

5. The voltage control device of claim 1, wherein the estimation of the CVR factor according to the load state estimates the CVR factor according to at least one of a load-specific operating state, a load-specific power output, and a load-specific amount of load or power consumption.

6. The voltage control device of claim 1, wherein the estimation of the CVR factor according to the representative value estimates the representative value of the CVR factor according to the loads or the voltage regulator module by adopting a latest value from the CVR factor estimated according to the measurement time or the CVR factor estimated according to the load state or by averaging the estimated CVR factor.

7. The voltage control device of claim 1, wherein the CVR factor calculator is configured to calculate a CVR factor representative value using the estimated CVR factor, the CVR factor representative value being used in calculation of the target voltage of the voltage regulator module subject to voltage regulation, and the CVR factor representative value of the voltage regulator module is calculated using the CVR factor according to the loads located downstream of the voltage regulator module.

8. The voltage control device of claim 1, wherein the CVR factor according to the loads or the voltage regulator module calculated by the CVR factor calculator is estimated to be a constant in which characteristics according to the loads or the voltage regulator module are reflected.

9. A voltage control method comprising:

data collection of transmitting power data of a voltage regulator module to a data collector, wherein the voltage regulator module regulates a voltage supplied to loads or reversely transmitted from the loads;

target voltage calculation of calculating, by the voltage regulator module, a target voltage to be regulated and collecting and storing a load-specific conservation voltage reduction (CVR) factor;

power loss calculation of calculating a power loss of a line of a power system; and voltage control of controlling, by a cooperative controller, the voltage regulator module according to the target voltage or sending the target voltage to the voltage regulator module, wherein the target voltage is calculated by reflecting a voltage drop due to CVR using the CVR factor, and the CVR factor is estimated in different methods according to at least one of a measurement time, a load state, and a representative value, wherein a reduction in power caused by the voltage drop due to CVR is calculated by multiplying the voltage drop to the target voltage and the CVR factor, and the voltage drop to the target voltage is determined by reflecting the line power loss calculated in the power loss calculation.

10. The voltage control method of claim 9, wherein the target voltage calculation actually measures a load-specific voltage, the actual measuring of the load-specific voltage corresponds to or is performed separately from the data collection, and when load-specific CVR factor is maintained in a predetermined range like unique characteristics of the loads, the actual measuring of the load-specific voltage has a scanning cycle or a collection cycle separate from collection of the power data of the data collection.

11. The voltage control method of claim 9, wherein the load-specific CVR factor calculated in the collection and storing of the load-specific CVR factor is calculated by at least one or a combination of:

the estimation according to the measurement time including a condition applied to a voltage or power or an operating time of the voltage regulator module;

the estimation according to the load state including a load-specific operating state or an amount of load; and the estimation according to the representative value using the CVR factor obtained by the estimation according to the measurement time or the estimation according to the load state.

12. The voltage control method of claim 9, wherein the collection and storing of the load-specific CVR factor comprises classification according to the measurement time, wherein the classification according to the measurement time includes a case in which a specific condition for the power data comprising a voltage or power is met or a case in which the load-specific CVR factor is calculated according to a time at which the voltage regulator module operates.

13. The voltage control method of claim 9, wherein the collection and storing of the load-specific CVR factor comprises classification according to the load state, wherein the classification according to the load state estimates the load-specific CVR factor according to at least one of a load-specific operating state, a load-specific power output, and a load-specific amount of load or power consumption.

14. The voltage control method of claim 9, wherein the collection and storing of the load-specific CVR factor comprises classification according to the representative value, wherein the classification according to the representative value estimates the representative value of the load-specific CVR factor according to the loads or the voltage regulator module by adopting a latest value from the load-specific CVR factor estimated according to the measurement time or the CVR factor estimated according to the load state or averaging the estimated CVR factor.

15. The voltage control method of claim 9, wherein the collection and storing of the load-specific CVR factor comprises CVR factor representative value calculation, wherein the CVR factor representative value calculation calculates a CVR factor representative value using the load-specific CVR factor obtained in the collection and storing of the load-specific CVR factor, the CVR factor representative value being used in calculation of the target voltage of the voltage regulator module subject to voltage regulation, and the CVR factor representative value is calculated using the CVR factor according to the loads located downstream of the voltage regulator module.

16. The voltage control method of claim 9, wherein the target voltage calculation comprises at least one of:

calculating a first voltage in which the voltage drop due to CVR is reflected;

calculating a power loss due to a line loss; and calculating a second voltage modified by reflecting the power loss due to a line loss to the first voltage, wherein the load-specific CVR factor estimated in the collection and storing of the load-specific CVR factor is used in calculating the first voltage.

* * * * *